United States Patent
Moro et al.

(10) Patent No.: US 11,546,062 B1
(45) Date of Patent: Jan. 3, 2023

(54) WAVELENGTH-SELECTABLE FREE-SPACE OPTICAL COMMUNICATION

(71) Applicant: Meta Platforms, Inc., Menlo Park, CA (US)

(72) Inventors: Slaven Moro, San Diego, CA (US); Eric Douglas Miller, Sherman Oaks, CA (US); Stephen Philip Efthyvoulos, La Crescenta, CA (US); Chien-Chung Chen, Thousand Oaks, CA (US); Matthew Thomas Hunwardsen, Moorpark, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/235,754

(22) Filed: Apr. 20, 2021

Related U.S. Application Data

(60) Provisional application No. 63/014,036, filed on Apr. 22, 2020.

(51) Int. Cl.
*H04B 10/00* (2013.01)
*H04B 10/50* (2013.01)
*H01S 5/50* (2006.01)
*H01S 5/0683* (2006.01)
(Continued)

(52) U.S. Cl.
CPC ....... *H04B 10/505* (2013.01); *H01S 3/10023* (2013.01); *H01S 3/13013* (2019.08); *H01S 5/0683* (2013.01); *H01S 5/50* (2013.01)

(58) Field of Classification Search
CPC . H04B 10/112; H04B 10/1123; H04B 10/114; H04B 10/1143; H04B 10/1149; H04B 10/118; H04B 10/116; H04B 10/40; H04B 10/505; H04B 10/2507; H04B 10/5057; H04B 10/516
USPC ....... 398/118, 119, 127, 128, 129, 130, 131, 398/135, 136, 158, 159, 183, 188, 202, 398/208, 79, 85, 120, 121, 122, 123, 124, 398/125
See application file for complete search history.

(56) References Cited

U.S. PATENT DOCUMENTS

| | | |
|---|---|---|
| 4,635,299 A | 1/1987 | MacGovern |
| 4,867,560 A | 9/1989 | Kunitsugu |
| 5,517,016 A | 5/1996 | Lesh et al. |
| (Continued) | | |

FOREIGN PATENT DOCUMENTS

| | | |
|---|---|---|
| WO | 2020/112517 A1 | 6/2020 |

OTHER PUBLICATIONS

Roy et al. "Optical Feeder links for High Throughput Satellites", ICSOS IEEE Conference, Oct. 26, 2015, pp. 1-6.
(Continued)

*Primary Examiner* — Hanh Phan
(74) *Attorney, Agent, or Firm* — Greenberg Traurig, LLP

(57) ABSTRACT

An example device may include an optical configuration configured to transmit a transmitted optical beam and receive a received optical beam, an optical modem, and an optical amplifier. An example optical amplifier may include an optical gain medium and an optical bandpass filter. The transmitted optical beam may have a transmit wavelength selectable from a plurality of transmit wavelength, and may have a different wavelength from the received optical beam. In some examples, the optical configuration may include at least one dichroic element. Various other devices, systems, and methods are described.

19 Claims, 17 Drawing Sheets

(51) Int. Cl.
*H01S 3/13* (2006.01)
*H01S 3/10* (2006.01)

(56) References Cited

U.S. PATENT DOCUMENTS

| | | | |
|---|---|---|---|
| 6,522,437 B2* | 2/2003 | Presley | H04B 10/1125 |
| | | | 398/139 |
| 6,731,415 B1 | 5/2004 | Plett | |
| 6,731,833 B2 | 5/2004 | Sandler et al. | |
| 6,819,874 B2 | 11/2004 | Cheng et al. | |
| 6,968,098 B2 | 11/2005 | Barrett | |
| 8,362,410 B2 | 1/2013 | King et al. | |
| 8,383,982 B2 | 2/2013 | Bruland et al. | |
| 9,306,668 B2 | 4/2016 | DeVaul et al. | |
| 9,432,640 B2* | 8/2016 | Chang | H04N 9/3158 |
| 9,917,633 B2 | 3/2018 | DeVaul et al. | |
| 10,003,402 B2 | 6/2018 | Boroson et al. | |
| 10,298,325 B1 | 5/2019 | Birnbaum et al. | |
| 10,313,000 B2 | 6/2019 | Buer et al. | |
| 10,365,211 B2 | 7/2019 | Blasenheim et al. | |
| 10,411,829 B2 | 9/2019 | Birnbaum et al. | |
| 2002/0167702 A1 | 11/2002 | Badesha et al. | |
| 2004/0042798 A1 | 3/2004 | Kehr et al. | |
| 2004/0141754 A1 | 7/2004 | Cheng et al. | |
| 2006/0024061 A1 | 2/2006 | Wirth et al. | |
| 2006/0056851 A1* | 3/2006 | Takahashi | H04B 10/118 |
| | | | 398/118 |
| 2011/0268453 A1 | 11/2011 | Fest et al. | |
| 2015/0043906 A1* | 2/2015 | Zhou | H04J 14/0256 |
| | | | 398/25 |
| 2015/0188628 A1 | 7/2015 | Chalfant, III et al. | |
| 2015/0215040 A1 | 7/2015 | Dickson et al. | |
| 2015/0249498 A1 | 9/2015 | Minguez Rascon et al. | |
| 2016/0072586 A1* | 3/2016 | Hochberg | H04J 14/06 |
| | | | 398/136 |
| 2016/0134375 A1* | 5/2016 | Kakande | H04J 14/02 |
| | | | 398/135 |
| 2016/0182140 A1 | 6/2016 | DeVaul et al. | |
| 2016/0204861 A1 | 7/2016 | Boroson et al. | |
| 2016/0204865 A1 | 7/2016 | Boroson et al. | |
| 2016/0204866 A1* | 7/2016 | Boroson | H04B 10/61 |
| | | | 398/97 |
| 2017/0054499 A1 | 2/2017 | Graves et al. | |
| 2017/0054527 A1 | 2/2017 | Birnbaum et al. | |
| 2017/0183095 A1 | 6/2017 | Liu et al. | |
| 2017/0237500 A1* | 8/2017 | Nishimoto | H04B 10/50575 |
| | | | 398/184 |
| 2017/0366262 A1 | 12/2017 | Turgeon et al. | |
| 2018/0019816 A1 | 1/2018 | Wang et al. | |
| 2018/0172915 A1* | 6/2018 | Kim | G02B 6/29395 |
| 2018/0191428 A1 | 7/2018 | Hemmati et al. | |
| 2019/0078858 A1 | 3/2019 | Miller et al. | |
| 2019/0081703 A1 | 3/2019 | Miller et al. | |
| 2019/0245265 A1 | 8/2019 | Booen et al. | |
| 2020/0169323 A1 | 5/2020 | Moro | |
| 2020/0396003 A1 | 12/2020 | Moro | |

OTHER PUBLICATIONS

Dimitrov et al., "Digital Modulation and Coding for Satellite Optical Feeder Links", ASMS/SPSC Conference (IEEE), Sep. 8, 2014, 10 pages.

Dimitrov et al., "Digital Modulation and Coding for Satellite Optical Feeder Links with Pre-distortion Adaptive Optics", Int. J. Satell. Comm. Network., Nov. 11, 2015, pp. 1-22.

* cited by examiner

Optical Bandpass Filter
1100

Optical Bandpass Filter 1300

Method 1700

WAVELENGTH-SELECTABLE FREE-SPACE OPTICAL COMMUNICATION

CROSS REFERENCE TO RELATED APPLICATION

This application claims the benefit of U.S. Provisional Application No. 63/014,036, filed 22 Apr. 2020, the disclosure of which is incorporated, in its entirety, by this reference.

BRIEF DESCRIPTION OF DRAWINGS

The accompanying drawings illustrate a number of exemplary embodiments and are a part of the specification. Together with the following description, these drawings demonstrate and explain various principles of the present disclosure.

Figure 1:
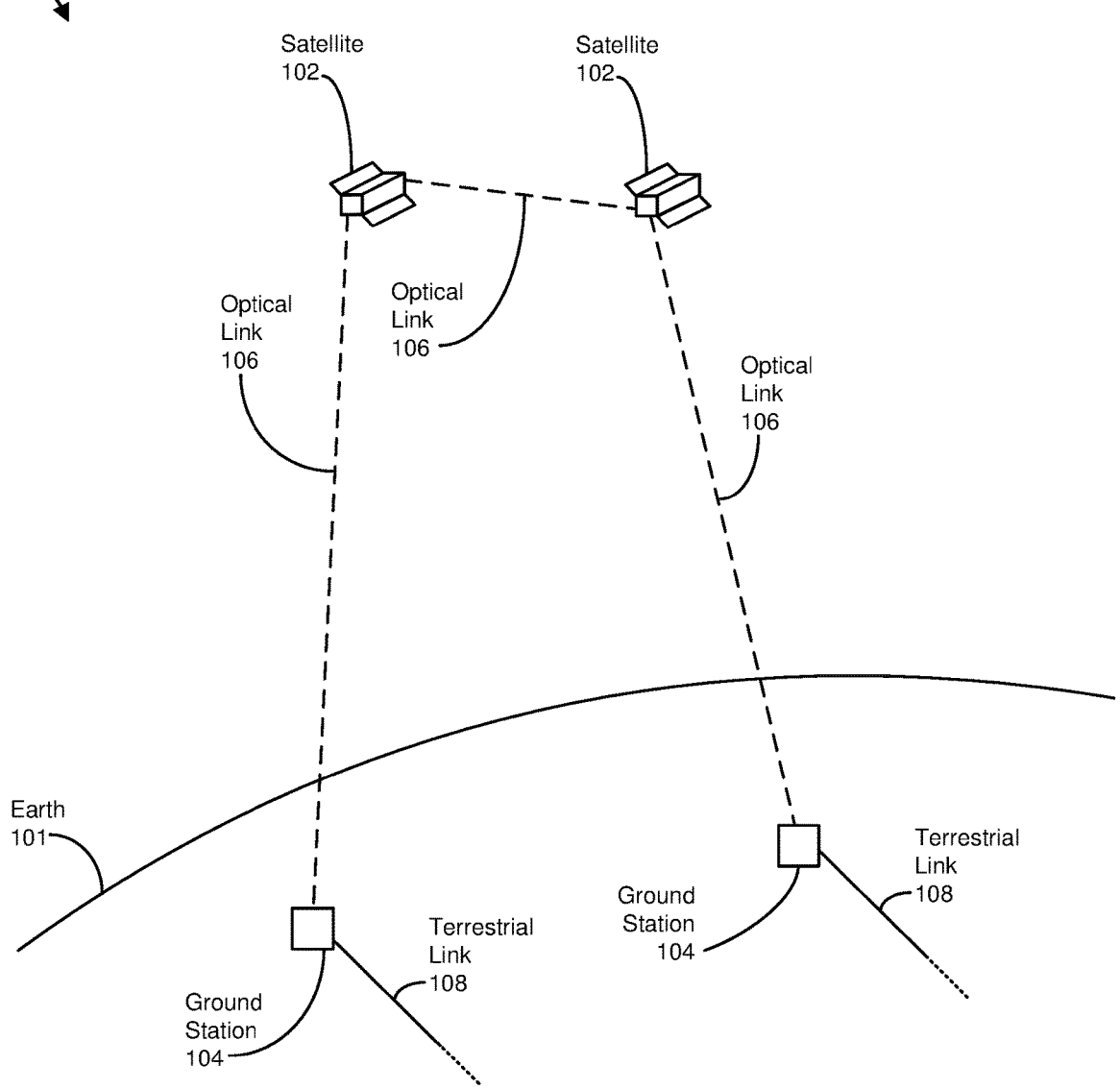
FIG. 1 is a graphical representation of an exemplary satellite optical communication system in which systems and methods for wavelength-selectable free-space optical (FSO) communication, as discussed herein, may be employed.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and are described in detail herein. However, the exemplary embodiments described herein are not intended to be limited to the particular forms disclosed. Rather, the present disclosure covers all modifications, equivalents, and alternatives falling within this disclosure.

DETAILED DESCRIPTION OF EXEMPLARY EMBODIMENTS

In at least some free-space optical (FSO) communication systems, substantial amounts of isolation between "transmit" and "receive" signals are often desired to reduce or eliminate crosstalk therebetween. Such isolation between signals may be achieved by differences in spatial separation, polarization, and/or wavelength of the signals. To use different wavelengths for signal isolation, optical elements that possess fixed properties in terms of wavelength specific performance characteristics are often utilized. Consequently, for two terminals of a system to form a communication link therebetween, each terminal typically employs a different, and thus compatible, wavelength arrangement or "plan". For example, a first terminal employing a wavelength plan "A" may use a transmit signal having a first wavelength and expect a receive signal having a second wavelength. Accordingly, for a second terminal to communicate with the first terminal, the second terminal may utilize a different, but compatible, second wavelength plan "B" that uses a transmit signal having the second wavelength and expects a receive signal having the first wavelength.

The present disclosure is generally directed to wavelength-selectable FSO communication systems. In some embodiments, a communication terminal may employ one or more optical components that may utilize a plurality of selectable wavelengths for compatibility with a variety of other terminals. In some examples, each terminal or some managing system thereof may select optical signal wavelengths associated with a particular wavelength plan that renders the terminal compatible with another for optical communication therebetween. Consequently, in some embodiments, FSO communication links may be formed between a variety of different pairs of terminals within an overall communication system.

FIG. 1 is a graphical representation of an exemplary satellite optical communication system 100 in which embodiments of wavelength-selectable FSO communication terminals and methods, as discussed herein, may be employed. In satellite optical communication system 100, one or more satellites 102 (e.g., low Earth orbit (LEO) communication satellites that may be configured as a communication constellation) may facilitate communication between two or more ground stations 104 (e.g., ground stations that are geographically separated on Earth 101 to an extent that direct communication therebetween is not advisable) using optical links 106. In some examples, each ground station 104 may be coupled to other communication devices via terrestrial links 108 (e.g., wired communication links, wireless communication links, and the like), thus serving as a portion of a larger communication network. In some embodiments, each optical link 106 may operate as a unidirectional or bidirectional communication link.

In satellite optical communication system 100, each optical link 106 between the satellite 102 and a ground station 104 may be formed using compatible wavelength plans. For example, each satellite 102 may utilize a first wavelength plan and each ground station 104 may use a second wavelength plan compatible with the first wavelength plan. However, use of the first wavelength plan by two satellites 102 may prevent formation of optical link 106 therebetween, as each satellite 102 may be expecting to receive optical signals of an incorrect wavelength from its corresponding satellite 102. Consequently, the ability of one satellite 102 to switch to the second wavelength plan may facilitate formation of the desired optical link 106 between the two satellites 102.

While FIG. 1 represents one particular example of an FSO communication system, other types, such as those that do not employ a satellite or ground station as a communication terminal, may also benefit from application of the various principles described in greater detail below.

Figure 2:
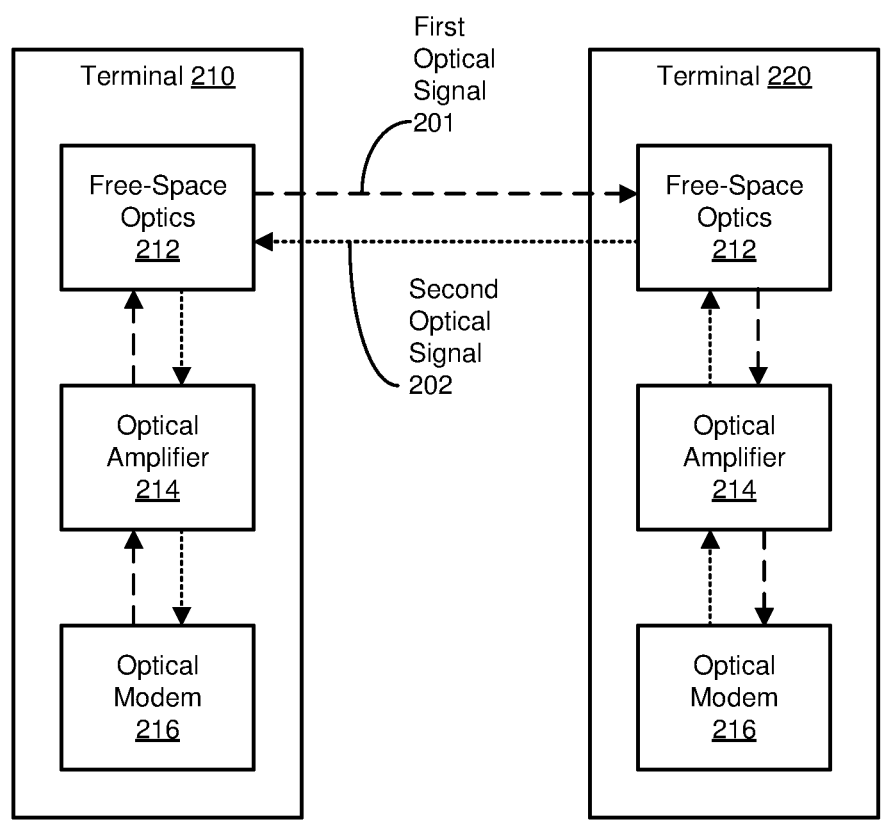
FIG. 2 is a block diagram of an exemplary free-space optical communication system employing selectable wavelengths.

FIG. 2 is a block diagram of an exemplary FSO communication system 200 employing selectable wavelengths. As depicted in FIG. 2, FSO communication system 200 may include a first terminal 210 and a second terminal 220 between which a first optical signal 201 of a particular wavelength is transmitted from terminal 210 to second terminal 220. Also, a second optical signal 202 of a different wavelength (e.g., to facilitate isolation between first optical signal 201 and second optical signal 202) is transmitted from second terminal 220 to first terminal 210, thus forming a bidirectional communication link between terminals 210 and 220. Further, as depicted in FIG. 2, each terminal 210 and 220 may include free-space optics 212, an optical amplifier 214, and an optical modulator-demodulator (modem) 216. Terminals 210 and 220 may each include other components or elements, but such components are not specifically discussed herein to facilitate and focus the following discussion.

In some examples, free-space optics 212 may include one or more lenses, mirrors, dichroic elements, actuators, and/or other optical, electrical, or mechanical components. In first terminal 210, free-space optics 212 may receive an optical signal from optical amplifier 214 and transmit that optical signal (e.g., first optical signal 201 having a first wavelength) in free space (e.g., to second terminal 220). Further, free-space optics 212 of first terminal 210 may receive second optical signal 202 having a second wavelength from second terminal 220 and direct that signal to optical amplifier 214. Particular examples of free-space optics 212 are described more fully below in conjunction with FIGS. 3-8.

Optical amplifier 214 of first terminal 210 may amplify both first optical signal 201 received from free-space optics 212 and second optical signal 202 received from optical modem 216. In some embodiments, optical amplifier 214 may include one or more optical gain media, pump lasers, optical filters, and the like, examples of which are described in greater detail below in connection with FIGS. 9-14.

In some embodiments, optical modem 216 of first terminal 210 may modulate light (e.g., laser light) of a particular wavelength using data (e.g., communication data) and provide the modulated light to optical amplifier 214. Further, in some examples, optical modem 216 may receive amplified light from optical amplifier 214 that is received from second terminal 220 via free-space optics 212 and demodulate the amplified light to recover the data carried therein. In some embodiments, optical modem 216 may include one or more lasers or other light oscillators, optical switches, optical modulators, optical demodulators, and/or digital signal processors (DSPs). Particular embodiments of optical modem 216 are discussed below in relation to FIGS. 15 and 16.

As illustrated in FIG. 2, second terminal 220 may also include free-space optics 212, optical amplifier 214, and optical modem 216 that are substantially similar or identical to the corresponding components of first terminal 210. However, unlike first terminal 210, which is configured to modulate, amplify, and transmit first optical signal 201 while receiving, amplifying, and demodulating second optical signal 202, as described above, second terminal 220 and its various components may be oppositely configured to modulate, amplify, and transmit second optical signal 202 while receiving, amplifying, and demodulating first optical signal 201, thus implementing a wavelength plan that is different from, but compatible with, the wavelength plan implemented in terminal 210. Further, in the examples described below, terminals 210 and 220 may be reconfigured to implement more than one wavelength plan to foster flexibility in the use of terminals 210 and 220 within an FSO communication network.

In most of the embodiments described below, two possible optical signal wavelengths (e.g., referred to as a first wavelength and a second wavelength) may be processed by each of free-space optics 212, optical amplifier 214, and optical modem 216. However, in other examples not specifically described herein, three or more wavelengths may be processed to provided even greater implementation flexibility. Also, in some examples, terminals 210 and 220 may include control logic (e.g., a hardware processor, an embedded processor core, or the like that may execute software instructions) that may dynamically configure one or more of free-space optics 212, optical amplifier 214, and/or optical modem 216 to implement a particular wavelength plan (e.g., based on the paired terminal with which terminal 210 or 220 is to communicate). In some embodiments, the wavelength plans may be scheduled in advance, coordinated dynamically by an internal or external control system, and so on.

FIGS. 3-8 are block diagrams of exemplary free-space optics (e.g., serving as free-space optics 212) employable in FSO communication system 200 of FIG. 2. In each of the illustrated examples, the corresponding free-space optics includes first fiber collimator 303 and second fiber collimator 304, as well as beam expander 306. In some embodiments, fiber collimators 303 and 304 are coupled to an end of corresponding fiber optic cables (not depicted in FIGS. 3-8) that couple the free-space optics to an optical amplifier (e.g., optical amplifier 214). More specifically, first fiber collimator 303 may carry an optical signal from a fiber optic cable for transmission to a partner communication terminal while second fiber collimator 304 may carry an optical signal received from the partner communication terminal onto a separate fiber optic cable. Additionally, beam expander 306, in some embodiments, may expand the width of the optical signal (e.g., optical beam) prior to being transmitted via free space to the partner terminal and/or contract the optical beam after being received from the partner terminal for compatibility with the remainder of the free-space optics. In other embodiments, beam expander 306 may not be included in the free-space optics. Additionally, in some examples, an optical beam director (e.g., positioned at a free-space output of beam expander 306, but not depicted in FIGS. 3-8) may be employed to direct or steer the incoming and/or outgoing optical lines of sight to the partner communication terminal. Also, in some examples, instead of including fiber collimators 303 and 304, the free-space optics may include a laser diode or other light generator to produce the optical signal to be transmitted to the partner terminal and/or a photodiode or other light detector to detect the optical signal received from the partner terminal. Moreover, while various particular optical components, including one or more mirrors or other reflecting surfaces, are described in the various examples described below, greater or fewer numbers of such components may be employed in some embodiments to conform the free-space optics to various component packaging and/or layout constraints.

Figure 3:
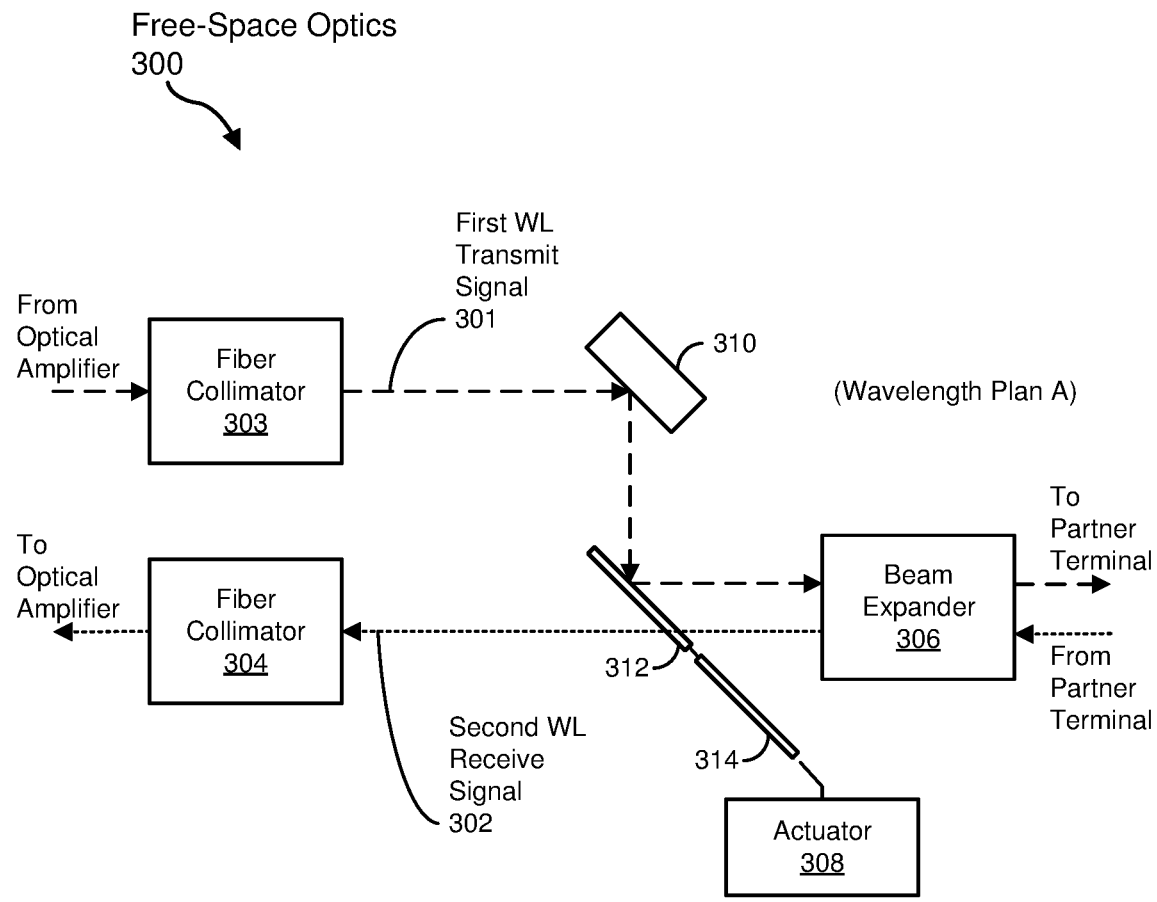
FIGS. 3-4 are block diagrams of exemplary free-space optics employable in the optical communication system of FIG. 2, including a pair of dichroic elements.
Figure 4:
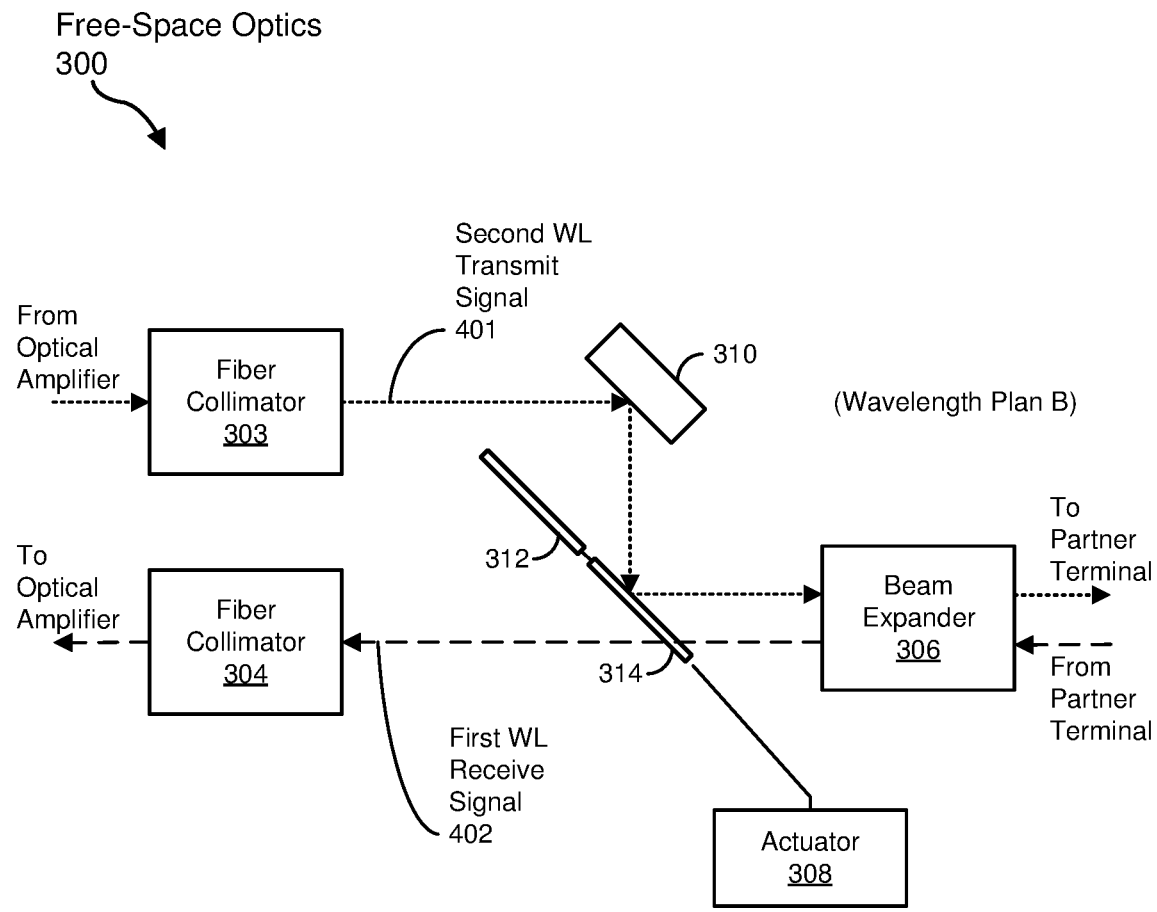

FIGS. 3 and 4 depict free-space optics 300 as configured according to two different wavelength plans. More particularly, FIG. 3 shows free-space optics 300 configured for a wavelength plan A, in which a first wavelength (WL) transmit signal 301 is directed from first fiber collimator 303 through beam expander 306 for transmission to a partner terminal while a second WL receive signal 302 is received from the partner terminal via beam expander 306 to second fiber collimator 304. Conversely, FIG. 4 illustrates the same free-space optics 300 arranged for a wavelength plan B, in which a second WL transmit signal 401 is directed from first fiber collimator 303 through beam expander 306 for transmission to a partner terminal while a first WL receive signal 402 is received from the partner terminal via beam expander 306 to second fiber collimator 304. Accordingly, by virtue of a change in configuration (e.g., a physical arrangement of one or more optical components), transmit and receive optical signals may be combined over the communication link with the partner terminal and separated between transmission and reception portions of the optical amplifier coupled to free-space optics 300 (e.g., via fiber collimators 303 and 304) by distinguishing the wavelength of the two signals involved.

This change in configuration, in some embodiments, may be performed by way of a pair of dichroic elements 312 and 314 (e.g., dichroic filters) coupled to an actuator 308. In some examples, dichroic elements 312 and 314 may be separate elements moved together via actuator 308 or may be two portions of the same unitary element moved using actuator. In addition, in some embodiments, actuator 308 may be a linear actuator, a rotary actuator, or another type of actuator that imparts movement on dichroic elements 312 and 314. Other arrangements other than those depicted in FIGS. 3 and 4 that are capable of moving each dichroic element 312 to a particular location and/or orientation to direct and/or pass optical signals based on their wavelength are also possible. More specifically, a dichroic element may reflect light of a first wavelength or range of wavelengths while allowing a second wavelength or range of wavelengths to pass therethrough.

In FIG. 3, to implement wavelength plan A, actuator 308 may position a first dichroic element 312 within a path of first WL transmit signal 301 and second WL receive signal 302 (e.g., near a side of beam expander 306 nearest fiber collimators 303 and 304). As shown, first dichroic element 312 reflects light of the first wavelength (e.g., first WL transmit signal 301) while allowing light of the second wavelength (e.g., second WL receive signal 302) to pass therethrough. Accordingly, when placed in the light path (e.g., at an angle to light received from beam expander 306, such as at 45 degrees), first dichroic element 312 allows second WL receive signal 302 to pass directly to second fiber collimator 304 on its way to the optical amplifiers, while reflecting first WL transmit signal 301 (e.g., received from first fiber collimator 303 via a broadband mirror 310) to beam expander 306 for transmission to the partner terminal. Other optical elements aside from broadband mirror 310 may be employed to redirect first WL transmit signal 301 and other optical signals, as described below, in other examples. Consequently, free-space optics 300 may facilitate the alignment of first WL transmit signal 301 and second WL receive signal 302 with their associated fiber collimators 303 and 304 while also allowing first WL transmit signal 301 and second WL receive signal 302 to be carried in a single beam, or two closely positioned beams, to and from the partner terminal.

Further, as illustrated in FIG. 4, free-space optics 300 may be reconfigured using actuator 308 to implement different wavelength plan B, in which the wavelengths of the transmit and receive signals (e.g., second WL transmit signal 401 and first WL receive signal 402) are reversed relative to wavelength plan A of FIG. 3. To provide such functionality, actuator 308 may replace first dichroic element 312 in the optical path with second dichroic element 314 that reflects light of the second wavelength (e.g., second WL transmit signal 401) while allowing light of the first wavelength (e.g., first WL receive signal 402) to pass through. Consequently, when placed in the light path, second dichroic element 314 allows first WL receive signal 402 to pass directly to second fiber collimator 304 on its way to the optical amplifier, while reflecting second WL transmit signal 401 (e.g., received from first fiber collimator 303 via broadband mirror 310) to beam expander 306 for transmission to the partner terminal.

Figure 5:
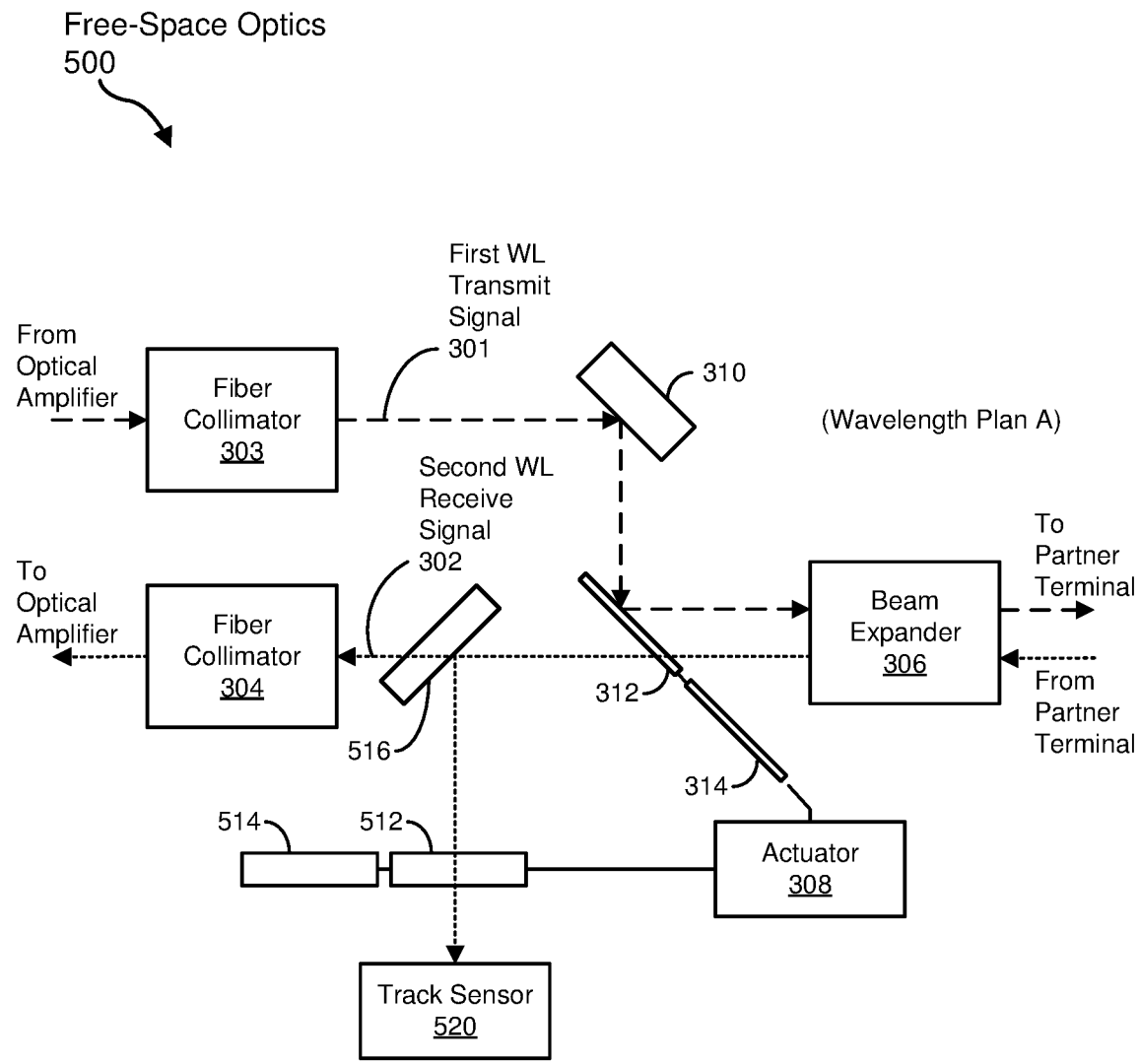
FIGS. 5-6 are block diagrams of exemplary free-space optics employable in the optical communication system of FIG. 2, including a track sensor.
Figure 6:
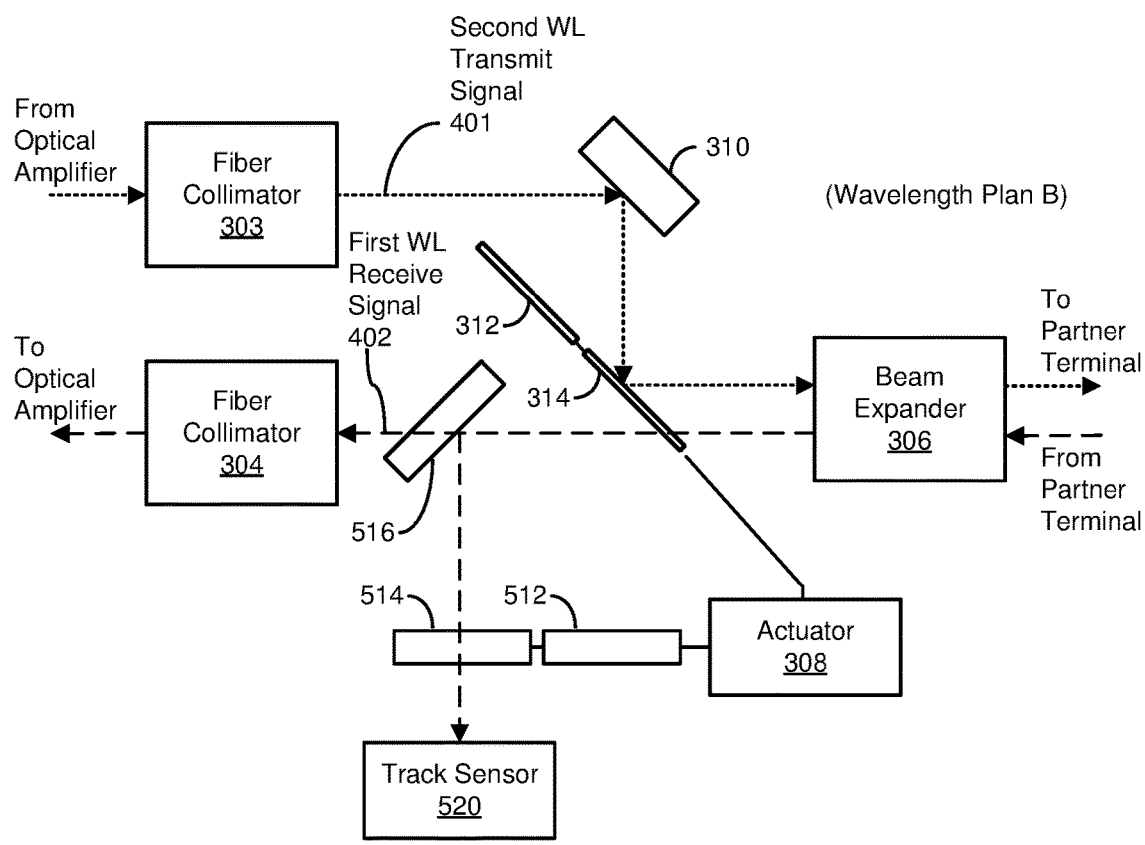

Accordingly, free-space optics 300, as described above, may implement two different wavelength plans with the same reconfigurable components. FIGS. 5 and 6 provide substantially similar free-space optics 500 to that of FIGS. 3 and 4, with additional components to implement beam tracking (e.g., of a communication beam between the current terminal and its partner terminal). These additional components may include a beam splitter 516, a track sensor 520 (e.g., a quadrant photodetector), a first narrowband filter 512, and a second narrowband filter 514. For example, in free-space optics 500, when configured to implement wavelength plan A, as shown in FIG. 5, actuator 308 positions first dichroic element 312 as discussed above in connection with FIG. 3. Additionally, second WL receive signal 302, after passing through first dichroic element 312, may encounter beam splitter 516 that directs some portion of second WL receive signal 302 toward track sensor 520. Further, actuator 308 (or another actuator) may place first narrowband filter 512 between beam splitter 516 and track sensor 520 to allow passage of second WL receive signal 302, or some portion thereof, to track sensor 520 to reduce the effect of other unwanted wavelengths on the tracking operation. Oppositely, as depicted in FIG. 6 during wavelength plan B, actuator 308 may place second narrowband filter 514 between beam splitter 516 and track sensor 520 to allow first WL receive signal 402, or some portion of that signal, to track sensor 520. In such embodiments, the resulting tracking signal may result in improved tracking by filtering light of unwanted wavelengths regardless of the particular wavelength plan being implemented.

Figure 7:
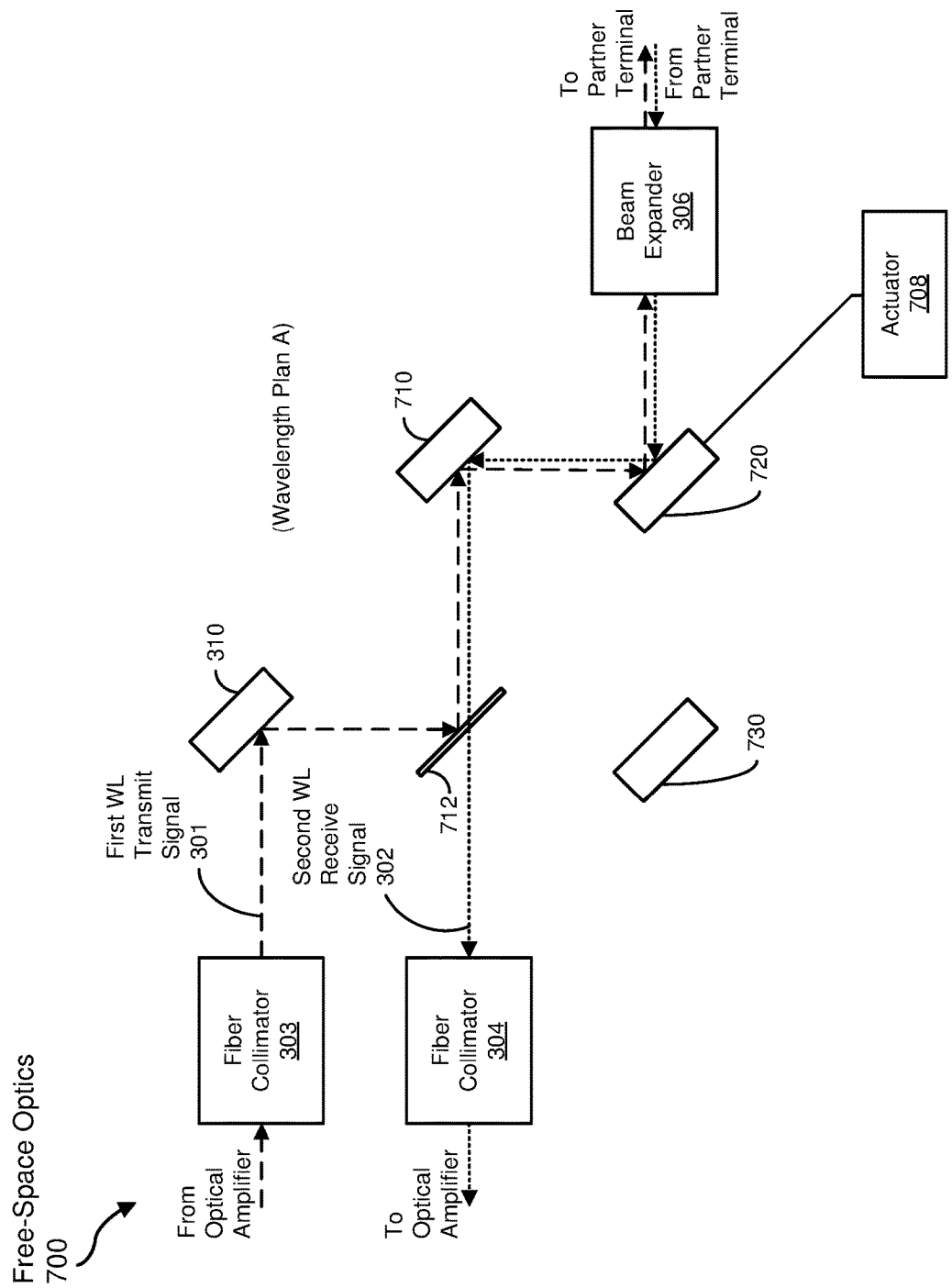
FIGS. 7-8 are block diagrams of exemplary free-space optics employable in the optical communication system of FIG. 2, including wide-band mirrors.
Figure 8:
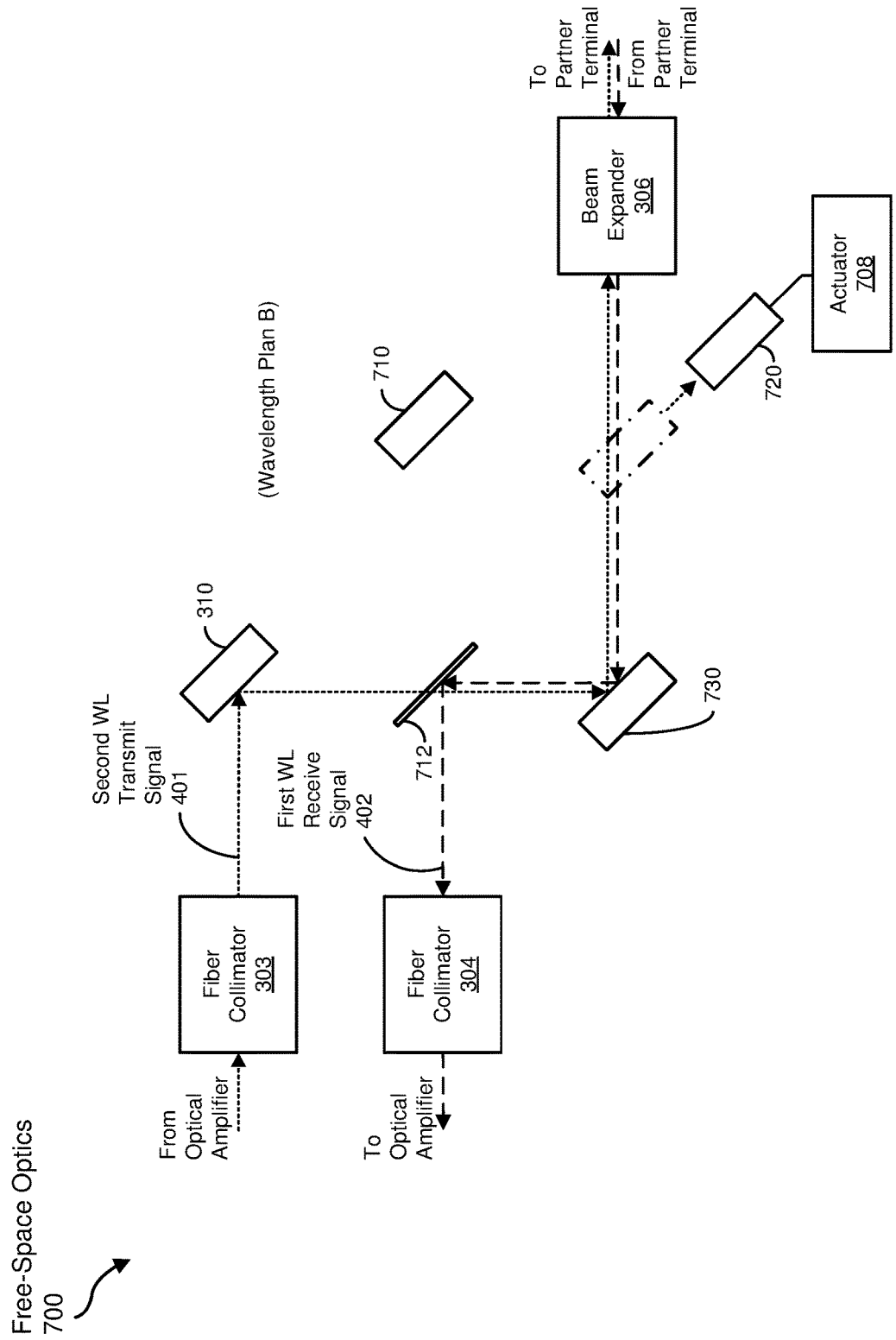

FIGS. 7 and 8 are block diagrams of free-space optics 700 (e.g., employable as free-space optics 212 of FIG. 2) that include a single stationary dichroic element 712 in conjunction with four broadband mirrors 310, 710, 720, and 730, one of which (e.g., broadband mirror 720) may be moved by an actuator 708 to selectively implement wavelength plan A or B. As shown in FIG. 7, while providing wavelength plan A, actuator 708 may position broadband mirror 720 so that first WL transmit signal 301 and second WL receive signal 302 follow a first optical path between beam expander 306 and dichroic element 712 via broadband mirror 710. In one embodiment, dichroic element 712 reflects light of the first wavelength while allowing light of the second wavelength to pass therethrough. Consequently, in wavelength plan A, dichroic element 712 allows second WL receive signal 302 to pass through to second fiber collimator 304 while reflecting first WL transmit signal 301 (e.g., received from first fiber collimator 303 via broadband mirror 310) to broadband mirror 710 and then broadband mirror 720, which reflects first WL transmit signal 301 to beam expander 306.

In FIG. 8, while operating according to wavelength plan B, free-space optics 700 may be configured such that actuator 708 may remove broadband mirror 720 from the optical path, thus allowing first WL receive signal 402 from beam expander 306 to encounter the opposing side of dichroic element 712 that was encountered by outgoing first WL transmit signal 301 during wavelength plan A in FIG. 7.

Consequently, dichroic element 712 may reflect first WL receive signal 402 toward second fiber collimator 304. Simultaneously, second WL transmit signal 401, arriving from first fiber collimator 303 via broadband mirror 310, may pass through dichroic element 712 before being reflected by broadband mirror 720 to beam expander 306. Consequently, a single dichroic element, along with a broadband mirror 720 that is moved into or out of an optical path of the system, may be employed to implement either of two wavelength plans involving two separate wavelengths.

While FIGS. 3-8 describe embodiments of free-space optics involving two wavelength plans in which two separate wavelengths may be used for reception and transmission of optical signals, other embodiments similar to those described above may provide compatibility with three or more wavelength plans involving three or more different optical signal wavelengths. Such systems may include use of three or more dichroic elements or filters to provide the filtering, separation, and/or combination of optical signals that may be processed to enable implementation of the various wavelength plans.

Figure 9:
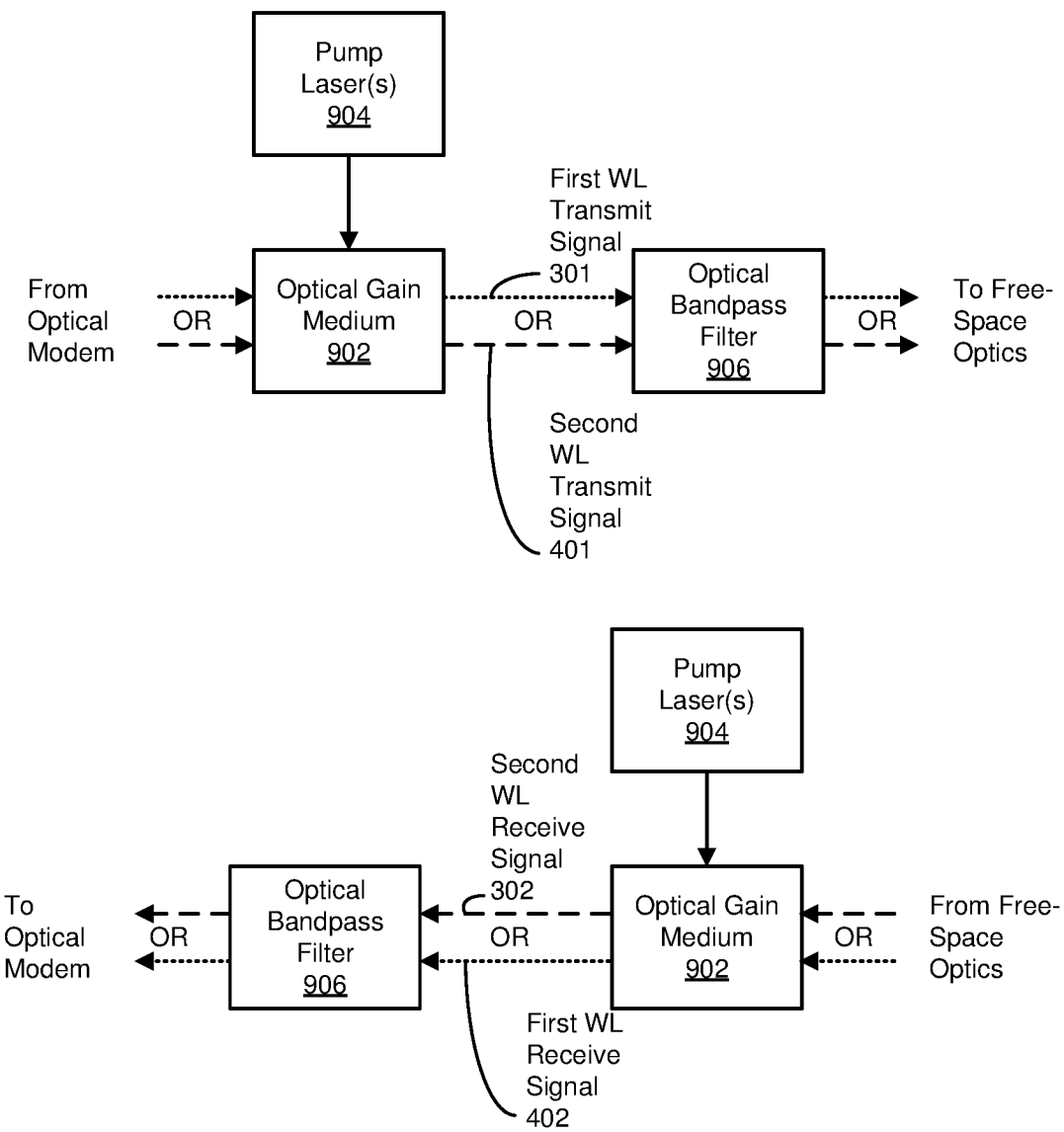
FIG. 9 is a block diagram of an exemplary optical amplifier employable in the optical communication system of FIG. 2.

FIG. 9 is a block diagram of an exemplary optical amplifier 900 employable in optical communication system 200 of FIG. 2 (e.g., as optical amplifier 214). In some embodiments, optical amplifier 900 may include one or more optical gain media 902, pump lasers 904, and optical bandpass filters 906. Generally, pump lasers 904 provide optical energy by which an optical signal is amplified within an optical gain medium 902. The amplified optical signal may then be passed through optical bandpass filter 906 to filter unwanted optical light (e.g., amplified spontaneous emissions (ASE) of optical gain medium 902 outside the intended wavelength or range of wavelengths of the optical signal).

As depicted in FIG. 9, optical amplifier 900 may include a transmit amplifier portion for optical signals generated by an optical modem (e.g., optical modem 216) for transmission via free-space optics (e.g., free-space optics 212) and a receive amplifier portion for optical signals received by the free-space optics for processing by the optical modem. In such embodiments, optical amplifier 900 amplifies the transmit and receive optical signals for each wavelength plan that may be implemented in the communication terminal. For example, FIG. 9 presumes the use of wavelength plans A and B described above. Consequently, optical amplifier 900 may amplify first wavelength transmit signal 301 and second wavelength receive signal 302 of wavelength plan A as well as second wavelength transmit signal 401 and first wavelength receive signal 402 of wavelength plan B. In some embodiments, optical gain medium 902 and pump lasers 904 may provide optical amplification over a broad wavelength band to cover both wavelengths of wavelength plans A and B. Accordingly, in such embodiments, optical bandpass filter 906 may filter an incoming optical signal according to the wavelengths of the possible wavelength plans that may be implemented in the communication terminal.

Figure 12:
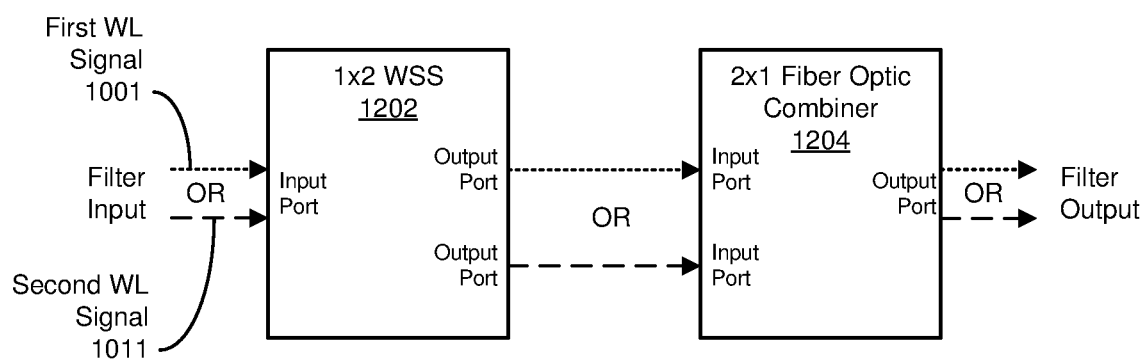
FIGS. 12-13 are block diagrams of exemplary optical bandpass filters employable in the optical amplifier of FIG. 9, including a wavelength-selectable switch (WSS).
Figure 13:
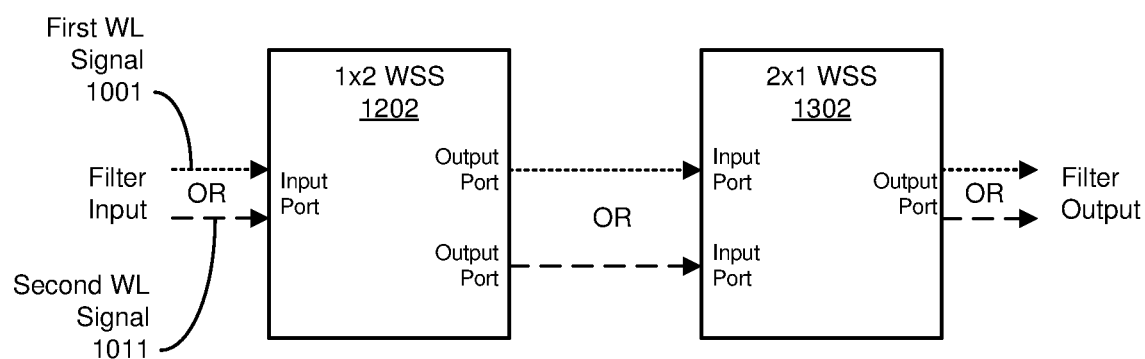
Figure 14:
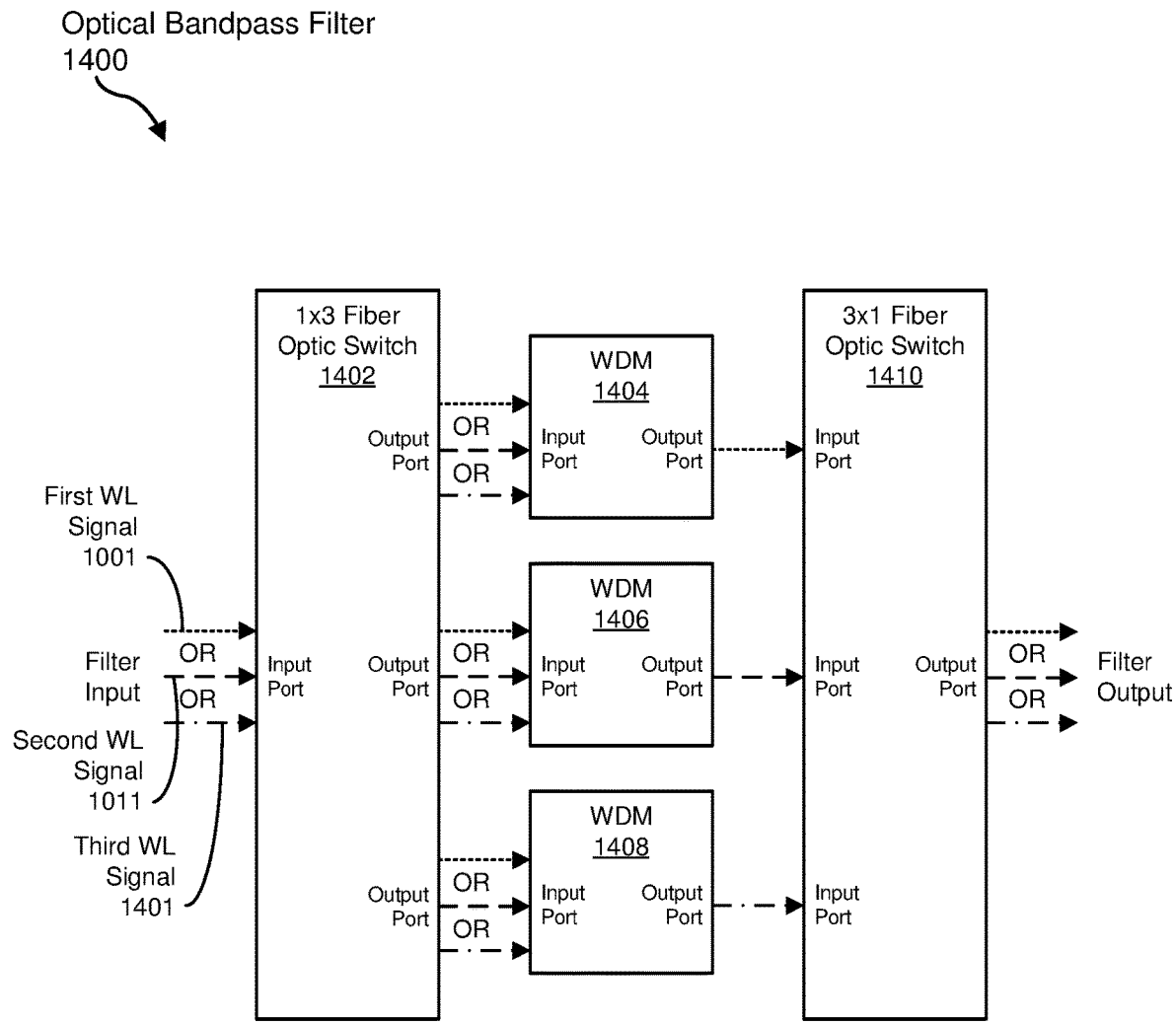
FIG. 14 is a block diagram of an exemplary optical bandpass filter employable in the optical amplifier of FIG. 9, including fiber optic switches.

FIGS. 10-14 are block diagrams of exemplary optical bandpass filters 1000, 1100, 1200, 1300, and 1400, respectively, that are employable as optical bandpass filter 906 in optical amplifier 900 of FIG. 9. Each of optical bandpass filters 1000, 1100, 1200, and 1300 of FIGS. 10-13 presume the use of wavelength plans A and B, as described above, in which either a first WL signal 1001 (e.g., first WL transmit signal 301 or first WL receive signal 402) or a second WL signal 1011 (e.g., second WL transmit signal 401 or second WL receive signal 302) are being amplified, depending on the selected wavelength plan currently being implemented. Optical bandpass filter 1400 of FIG. 14 depicts an example in which optical signals of three different wavelengths associated with three or more wavelength plans are processed.

Figure 10:
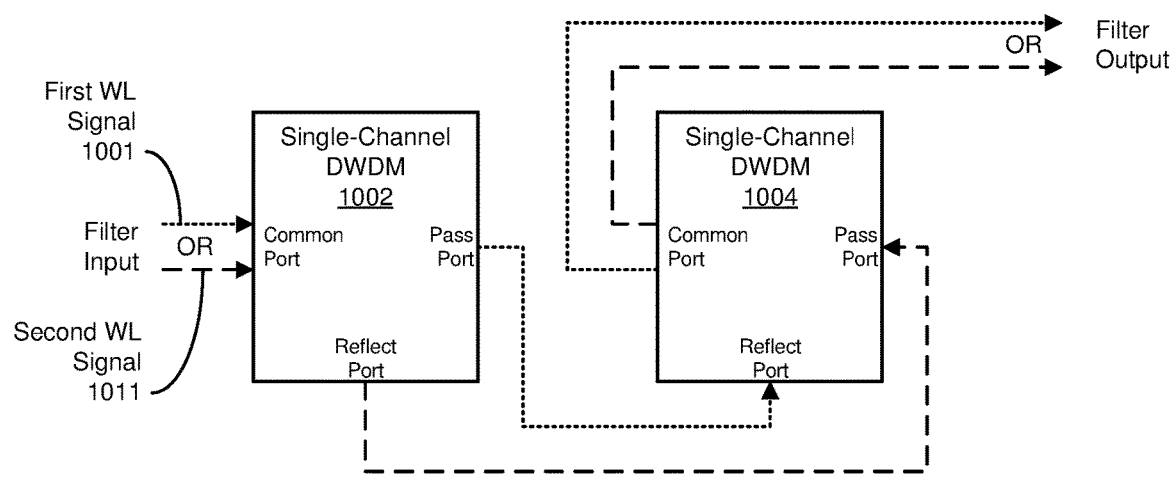
FIG. 10 is a block diagram of an exemplary optical bandpass filter employable in the optical amplifier of FIG. 9.

FIG. 10 is a block diagram of optical bandpass filter 1000, in which two single-channel dense wavelength-division multiplexers (DWDMs) 1002 and 1004 are deployed in series to filter wavelengths not associated with first WL signal 1001 and second WL signal 1011. Optical bandpass filter 1000 employs first signal-channel DWDM 1002 to receive the optical signal to be filtered at a common port and to output second WL signal 1011 via a reflect port while passing any other light that may include first WL signal 1001 via a pass port. Second single-channel DWDM 1004 may then receive second WL signal 1011 at a pass port while receiving the output of the pass port of first signal-channel DWDM 1002 that includes first WL signal 1001 through a reflect port, resulting in either first WL signal 1001 or second WL signal 1011 being forwarded via its common port as filter output for optical bandpass filter 1000 while other wavelengths are substantially filtered out from the filter output. In other examples, single-channel DWDMs 1002 and 1004 may be configured such that first WL signal 1001 is forwarded through the reflect port of first signal-channel DWDM 1002 and into the pass port of second single-channel DWDM 1004. In some embodiments, coarse wavelength-division multiplexers (CWDMs) or other wavelength-selective filters may be used in lieu of single-channel DWDMs 1002 and 1004. In other examples, additional wavelength-selective filters may be employed to handle three or more wavelengths.

Figure 11:
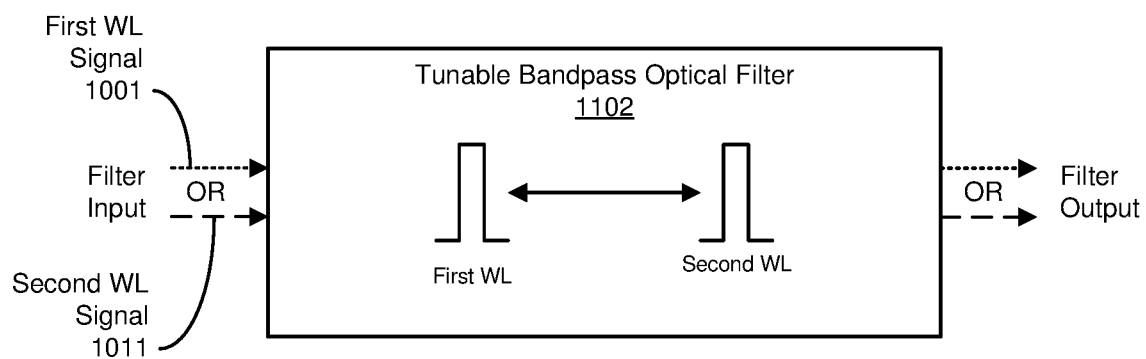
FIG. 11 is a block diagram of an exemplary tunable optical bandpass filter employable in the optical amplifier of FIG. 9.

FIG. 11 depicts optical bandpass filter 1000 having a tunable bandpass optical filter 1102 that may be configured to pass either the first wavelength of first WL signal 1001 or the second wavelength of second WL signal 1011 while filtering other wavelengths in the output of tunable bandpass optical filter 1102. Examples of tunable bandpass optical filter 1102 may employ a thermally tuned dual etalon cavity, an electrically tunable microelectromechanical system (MEMS) mirror with a fixed grating, or another tunable bandpass technology.

FIG. 12 is a block diagram of optical bandpass filter 1200 that employs a 1×2 wavelength-selectable switch (WSS) 1202 followed by a 2×1 fiber optic combiner 1204. In at least some embodiments, 1×2 WSS may dynamically route, block, and/or attenuate a range of DWDM wavelengths by way of electronic control. In operation, 1×2 WSS may receive an optical signal (e.g., either first WL signal 1001 or second WL signal 1011) and selectively direct the received signal to one of two outputs based on the wavelength of the input optical signal. Accordingly, 1×2 WSS 1202 may forward light of one wavelength or range of wavelengths (e.g., first WL signal 1001) to one output port, may forward light of another wavelength of range of wavelength (e.g., second WL signal 1011) to the other output port, and may prevent other wavelengths from being forwarded. 2×1 fiber optic combiner 1204 may receive the outputs of 1×2 WSS 1202 at corresponding inputs, where the associated inputs may be combined at an output port as the filter output. Consequently, 1×2 WSS 1202 may be dynamically configured to pass optical signals of either of two wavelengths while blocking light of other wavelengths. In other examples, use of a 1×N WSS in combination with an N×1 fiber optical combiner may facilitate the passing of one of N wavelengths or ranges of wavelengths while blocking light of other wavelengths to implement wavelength plans involving N wavelengths.

FIG. 13 is a block diagram of optical bandpass filter 1300 that employs 1×2 WSS 1202 in combination with a 2×1 WSS 1302 in lieu of 2×1 fiber optic combiner 1204. In operation, while 1×2 WSS 1202 may pass first WL signal 1001 or second WL signal 1011 to a particular one of its output ports, 2×1 WSS 1302 may direct the optical signal received at one of its input ports, each of which may receive its optical signal from a corresponding output port of 1×2 WSS 1202, to its output port as the filter output for optical bandpass filter 1300. In a fashion similar to optical bandpass filter 1200, optical bandpass filter 1300 may employ a 1×N WSS and an N×1 WSS in series to facilitate passing one or N wavelengths or ranges of wavelengths while blocking light of other wavelengths to implement a variety of wavelength plans.

FIG. 14 is a block diagram of optical bandpass filter 1400 that may filter optical signals involving three possible wavelengths: first WL signal 1001, second WL signal 1011, and a third WL signal 1401. In some embodiments, optical bandpass filter 1400 may include a 1×3 fiber optic switch 1402, three wavelength-division multiplexers (WDMs) 1404, 1406, and 1408, and a 3×1 fiber optic switch 1410. In operation, 1×3 fiber optic switch 1402 may receive any one of first WL signal 1001, second WL signal 1011, or third WL signal 1401 via an input and direct the received optical signal to one of three output ports based on a selected wavelength for the signal. Each output port may be directed to an input port of a corresponding WDM 1404, 1406, or 1408, each of which is configured to pass an optical signal of a corresponding wavelength or range of wavelengths to its output port. The output port of each WDM 1404, 1406, and 1408 may be coupled to a corresponding input port of 3×1 fiber optic switch 1410, which may be configured to pass an optical signal of a selected input port to its output port as filter output for optical bandpass filter 1400. Accordingly, in some embodiments, 1×3 fiber optic switch 1402 and 3×1 fiber optic switch 1410 may be configured to couple the filter input and filter output, respectively, to the one of the WDMs 1404, 1406, and 1408 that passes optical signals of the desired wavelength or range of wavelengths while filtering or blocking other wavelengths. More generally, in other embodiments, a 1×N fiber optic switch and an N×1 fiber optic switch may be coupled to N different WDMs in a similar manner to pass one of N different optical signals of corresponding wavelengths while filtering optical signals of other wavelengths.

Figure 15:
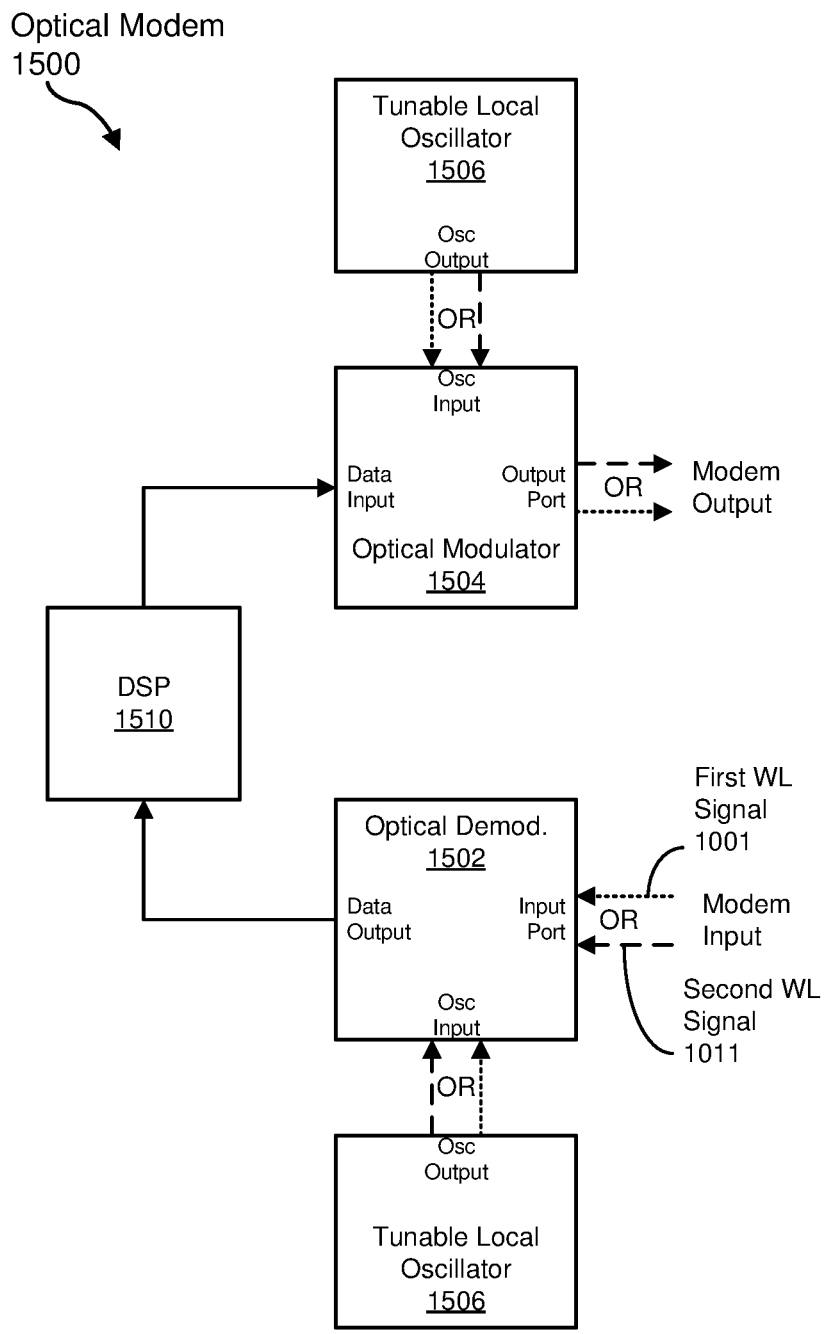
FIGS. 15 and 16 are block diagrams of exemplary optical modulator/demodulators (modems), for example, employable in the optical communication system of FIG. 2.
Figure 16:
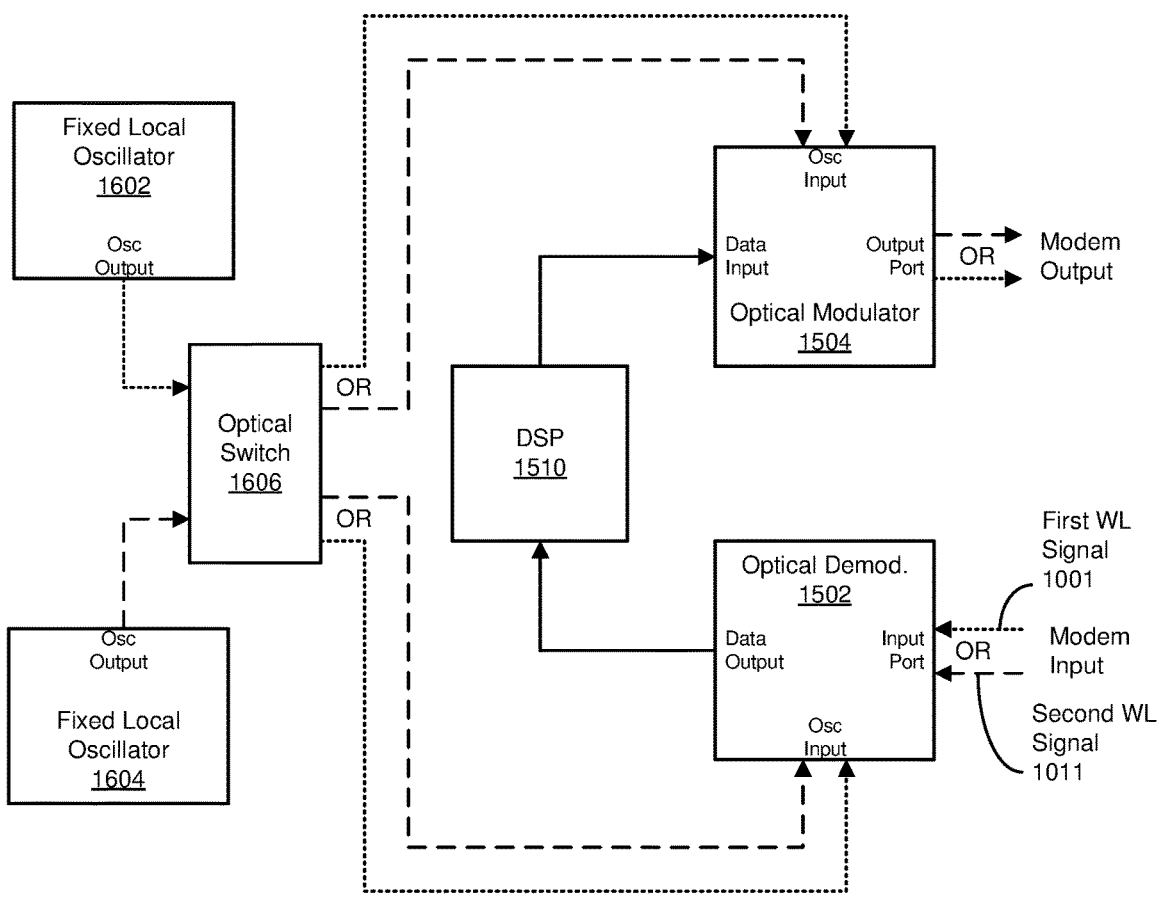

FIGS. 15 and 16 are block diagrams of exemplary optical modems 1500 and 1600, respectively, that are employable in optical communication system 200 of FIG. 2 (e.g., as optical modem 216). In optical modems 1500 and 1600, an optical demodulator 1502 may receive an optical signal from an optical amplifier (e.g., optical amplifier 214) at an input port to generate received data at a data output using an optical oscillator signal received at an oscillator input as a demodulation reference signal. The received data may be forwarded to a digital signal processor (DSP) 1510 or another processor capable of decoding and otherwise processing the received data to yield the desired data (e.g., user data) incorporated in the amplified signal that originated over an FSO communication link (e.g., from a partner terminal). Conversely, DSP 1510 may provide user data to be transmitted over that link to a data input of an optical modulator 1504, which may be used to modulate an optical signal received at an oscillator input to generate a modulated optical signal that is to be amplified by the optical amplifier prior to transmission over the optical link to the partner terminal.

In optical modems 1500 and 1600, based on the particular wavelength plan involved, optical demodulator 1502 and optical modulator 1504 may receive oscillator signals of different wavelengths (e.g., optical signals of a first wavelength and a second wavelength). Moreover, to provide flexibility in implementing multiple wavelength plans, as described above, optical modems 1500 and 1600 may selectively change the oscillator wavelength for the oscillator input of optical demodulator 1502 and optical modulator 1504. For example, optical demodulator 1502 may demodulate a signal of a first wavelength (e.g., first WL signal 1001) while optical modulator 1504 produces a modulated optical signal having a second wavelength (e.g., second WL signal 1011), and vice-versa.

To that end, in FIG. 15, optical modem 1500 may employ two tunable local oscillators 1506: one to produce an oscillator signal of one wavelength for optical demodulator 1502 and another to produce an oscillator signal of a different wavelength for optical modulator 1504. In some examples, each of the two tunable local oscillators 1506 may be dynamically tuned to generate an optical signal having a wavelength within some range of wavelengths to execute a particular wavelength plan. In some examples, tunable local oscillators 1506 may each be able to produce multiple wavelengths to provide compatibility with multiple wavelength plans.

In another embodiment, as depicted in FIG. 16, optical modem 1600 may instead employ two fixed oscillators 1602 and 1604 in conjunction with an optical switch 1606 (e.g., a 2×2 fiber optic switch) to couple the output of one fixed oscillator 1602 to either optical demodulator 1502 or optical modulator 1504 while coupling the output of the other fixed oscillator 1604 to the remaining optical demodulator 1502 or optical modulator 1504. In some examples, optical switch 1606 may be a polarization-maintaining optical switch, such as when a coherent modulation scheme (e.g., a modulation scheme that includes modulating light via changes in light polarization) is employed in optical modem 1600. In some embodiments, to facilitate signals of three or more (N) wavelengths, N fixed local oscillators may be coupled to optical demodulator 1502 and optical modulator 1504 via an N×2 fiber optic switch or similarly capable optical switch.

Figure 17:
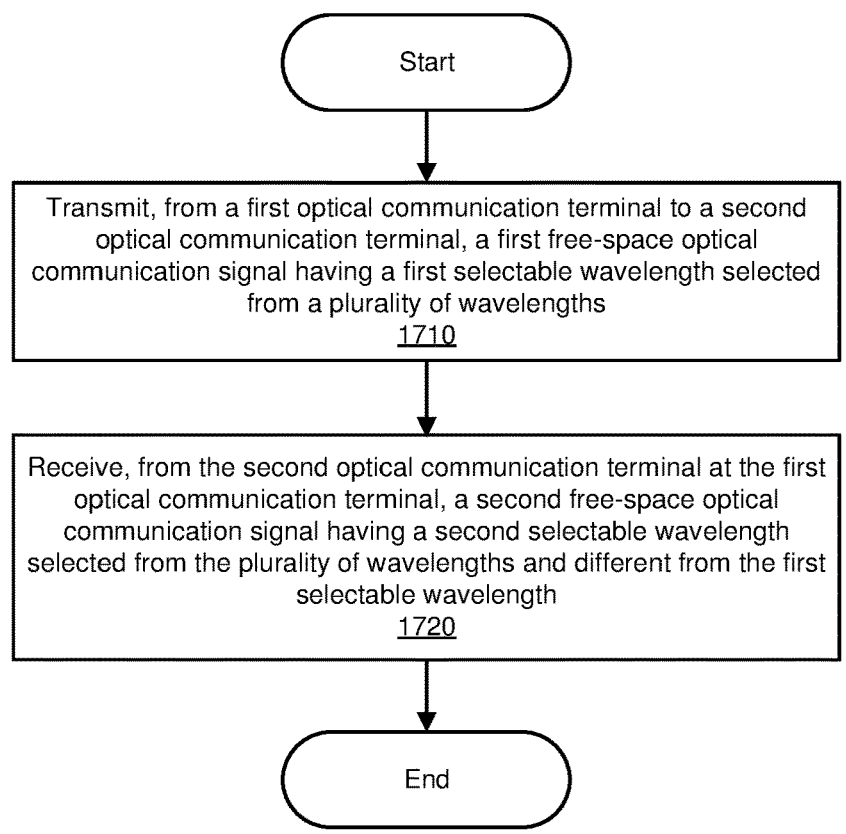
FIG. 17 is a flow diagram of an exemplary method of providing wavelength-selectable FSO communications.

FIG. 17 is a flow diagram of an exemplary method 1700 of providing wavelength-selectable FSO communications. While method 1700 is described in terms of the various embodiments discussed above (e.g., FSO communication system 200 of FIG. 2), other FSO communication systems not specifically described herein may be employed to perform method 1700 in other embodiments.

In the method 1700, at step 1710, a first free-space optical communication signal (e.g., first optical signal 201) having a first selectable wavelength selected from a plurality of wavelengths may be transmitted from a first optical communication terminal (e.g., terminal 210) to a second optical communication terminal (e.g., terminal 220). At step 1720, a second free-space optical communication signal (e.g., second optical signal 202) having a second selectable wavelength selected from the plurality of wavelengths and different from the first selectable wavelength may be received at the first optical communication terminal from the second optical communication terminal. In some embodiments, the first and second wavelengths may be associated with a first wavelength plan selected from two or more wavelength plans for the first communication terminal, as well as a second wavelength plan (e.g., different from, and compatible with, the first wavelength plan) selected from the same or a different plurality of wavelength plans employable by the second communication terminal.

In some examples, a free-space optical communication system may be configured to provide substantial amounts of isolation between transmit (TX) and receive (RX) signals (e.g., >60 dB may be desirable). In some examples, a desired degree of transmit/receive isolation may be obtained using one or more of the following: different transmit and receive wavelengths, different transmit and receive polarizations, and/or spatial separation of transmitted and received optical beams. A dichroic element may allow spatial separation of transmitted and received optical beams of different wavelength. In some examples, a dichroic element may be selected from a plurality of dichroic elements based on the transmitted and receive wavelengths. The dichroic element may transmit one wavelength (the transmitted or receive wavelength) and reflect the other.

In some examples, a communication terminal may be configured to transmit an optical beam having a particular transmit wavelength, and receive an optical beam on a particular receive wavelength. A pair of associated transmit and receive wavelengths may be termed a wavelength plan. For example, a communication terminal may communicate using a first wavelength plan (e.g., transmit wavelength A and receive wavelength B) with a remote communication terminal using a second wavelength plan (e.g., transmit wavelength B and receive wavelength A). A pair of communication terminals may communicate with each other (e.g., using free-space communication) if their wavelength plans are compatible. This may correspond to the transmit wavelength of one terminal being similar to the receive wavelength of the other, and vice versa for a bidirectional link.

In some examples, communication terminals may communicate using asymmetric links such as a space-to-ground link, or a LEO-to-GEO link (e.g., from a satellite in a low Earth orbit to a satellite in a geostationary orbit). In this context, asymmetric may mean that the two terminals have substantially different requirements and constraints. Fixed wavelength assignments may sometimes be used because of perceived operational constraints. However, for a ground-based communication terminal and a large number of satellites, it may be impractical to use only predetermined wavelength plans as this may limit the connection possibilities among satellites in the constellation.

It may be advantageous if an optical communication system (e.g., a ground-based terminal and a remote terminal such as a satellite) is configured to select compatible wavelength plans from a plurality of available wavelength plans. For example, one terminal may select a first wavelength to transmit (from a plurality of available wavelengths) and the other terminal may select the same wavelength to receive, and vice versa for a bidirectional link. A communication terminal having a plurality of available transmit wavelengths and/or a plurality of available receive wavelengths may select a particular wavelength plan compatible with communication with a remote terminal. A particular communication terminal may be configured to communicate with one or more other communication terminals (e.g., one or more other satellites or other terminals), if the other terminal may use (e.g., select) a compatible wavelength plan. with the same design. In some examples, one or more ground-based communication terminals may communicate with one or more of constellation of satellites.

A communication terminal may include an optical configuration (e.g., configured to free-space optics communications), an optical amplifier, and optical modem. An optical configuration may be reconfigurable, and may be configured to direct a selected received optical beam along a receive optical path, and direct the transmitted optical beam along a transmit optical path. The transmit and receive optical paths may differ along at least a portion of respective beam paths through the optical configuration. In some examples, a dichroic element may be used to transmit the transmitted optical beam and reflect the received optical beam, or vice versa.

In some examples, the optical amplifier may include a transmit optical amplifier configured to amplify a transmit signal from an optical modem, and may include a receive optical amplifier configured to amplify the received optical beam to provide a received optical signal to the optical modem. In some examples, the transmit optical amplifier and receive optical amplifier may be the same, for example, including the same optical gain medium, and in some examples may both be provided by the same component. However, in some examples, the transmit optical amplifier may be different from the receive optical amplifier, and the amplifiers may include different optical gain media.

In some examples, an optical modem may include an optical receiver (sometimes termed a demodulator), an optical modulator (for transmission), and a digital signal processor (e.g., configured to process transmitted and/or received network data). In some examples, an optical modem may include separate optical local oscillators (e.g., seed lasers) for transmit and receive. The transmit and/or the receive local oscillator may have adjustable wavelengths, which may be selected to obtain the transmit and receive wavelengths selected by the communication system (e.g., a free-space optics system).

The optical configuration, the optical modem, and optionally the optical amplifier (in some embodiments) may operate in a coordinated fashion to establish a free-space optical link with a remote terminal. In some examples, when first and second communication terminals attempt to establish a free-space communication link, each terminal may be assigned a certain wavelength plan, where the plans are selected to be compatible with each other. The selection and/or assignment of wavelengths plans may be performed by a controller associated with one or both of the communication terminals. The wavelength assignments may be scheduled in advance, or may be coordinated ad-hoc by a constellation-level control system or other controller. Upon receiving the wavelength assignments, each terminal may then configure the optical configuration, optical amplifier (optionally) and optical modem in a manner consistent with the wavelength plan, and then the two terminals may then establish a free-space optical link between them.

The optical configuration of an example communication terminal may include a reconfigurable optical assembly, which may be configured to direct the selected receive wavelength along the receive optical path, and direct the selected transmit wavelength along the transmit optical path. The transmit and receive optical path through the optical configuration may at least in part be different.

In some examples, an optical configuration may include a mechanism (such as one or more actuators and/or other adjustable mechanisms) configured to position a dichroic element within the optical path of the transmitted and/or received optical beams. The dichroic element may be selected from a plurality of dichroic elements, and the different dichroic elements within the plurality of dichroic elements may exhibit particular wavelength-specific reflection and transmission properties that may be compatible with one or more of a plurality of wavelength plans. The mechanism may include one or more linear actuators and/or one or more rotary actuators.

In some examples, a selectable dichroic element may be used to direct received and transmitted optical beams along respective received and transmitted optical paths. An optical assembly may include a plurality of dichroic elements, for example, within a dichroic element assembly. An actuator may be configured to place a selected dichroic element from the plurality of dichroic elements into the beam path. For example, one or more actuators may translate and/or rotate a dichroic element assembly so that a particular dichroic element is selected.

In some examples, a dichroic element may have a transmit band (e.g., one or more wavelengths that are transmitted through the dichroic element) and a reflect band (e.g., one or more wavelengths that are reflected by the dichroic element. In some examples, the receive wavelength may be transmitted, and the transmit wavelength may be reflected. In some examples, the transmit wavelength may be transmitted, and the receive wavelength may be reflected.

In some examples, a dichroic assembly may include a plurality of separate dichroic elements (e.g., separate optical elements which may have different coatings), or may include an optical element having different portions (e.g., having different coatings on different portions). A dichroic element may include a separate dichroic element within an assembly, or a portion of an optical element having a particular dichroic property. In some examples, a dichroic assembly may include a plurality of dichroic elements. A device may be configured to support two or more wavelength plans.

In some examples, an optical assembly may further include wavelength-specific tracking, for example, of a received optical beam. One or more optical components may be adjusted based on the received beam direction, and this may help reduce stray light (e.g., that may pass through or around the dichroic element).

In some examples, a dichroic element may be combined with a movable mirror in the optical path. In some examples, the mirror may be moved in or out of the optical path. Movement of the mirror into or out of the optical path of a received and/or transmitted optical beam may allow the respective beam(s) to be incident (or not) on a particular dichroic element.

In some examples, the device may include an optical transmitter and/or an optical receiver. These components may be part of the modem. In some examples, a device may include one or more of the following: one or more fiber collimators, a laser diode (e.g., as an optical transmitter component, which may be configured to allow modulated transmission), or a photodiode or other sensor (e.g., as an optical receiver component). In some examples, an optical configuration may include one or more fold mirrors configured to direct one or more optical beams along a zig-zag, back-and-forth, or otherwise redirected to reduce the physical size of a device. Transmitted wavelengths (and/or received wavelengths) may include visible and/or IR wavelengths. For example, the transmitted and/or received optical beams may be near-IR beams.

In some examples, an optical configuration may include a beam expander, which may be configured to expand the transmitted beam (e.g., to increase the beam diameter). This may help establishment of an optical link. The beam expander may be optionally configured to also reduce the beam diameter of the received optical beam (e.g., passing in the opposite direction to the transmitted optical beam through the beam expander). In some examples, a device may include an optical beam director. The optical beam director may be located on the output side of the wavelength-selective elements (e.g., a dichroic element), and in some examples may be located before or after the optional beam expander. The optical beam director may include a mirror controlled by one or more actuators configured to steer the transmitted (sometimes referred to as outgoing) optical beam, and in some examples may be configured to steer the received (sometimes referred to as incoming) optical beam. For example, an optical beam director may include a mirror or other reflective element (e.g., a prism or other reflector) controlled by linear and/or rotary actuators.

In some examples, a device may include at least one optical bandpass filter, sometimes referred to more concisely as a bandpass filter. A bandpass filter may be a component of the optical amplifier. In some examples, a bandpass filter may be used to exclude certain amplified spontaneous emission (ASE) wavelengths from the transmitted optical beam. For example, the transmitted optical beam may include a narrow band of wavelengths from those available from amplified spontaneous emission. A bandpass filter may be a component of one or both of the transmit and/or receive optical amplifier in the optical communication system. Tuning the bandpass filter of an example transmit optical amplifier may allow adjustment of the transmit wavelength.

In some examples, a bandpass filter may include a passive dual-band filter. In some examples, an arrangement of single-band filters may be used. Single-band filters may include one or more of a DWDM filter, a CWDM filter, or any other type of wavelength selective filter. The bandpass filter may have a bandwidth greater than that of the bandwidth of the transmitted optical beam (or received optical beam, as appropriate).

In some examples, a bandpass filter may include an active tunable filter, such as an active tunable filter single-band filter. A tunable filter may allow mechanical (e.g., mirror separation) or electrooptical tuning of the center wavelength (or center frequency) of the filter bandwidth, and/or the filter bandwidth. In some examples, a tunable optical filter may be used to provide wavelength-specific out-of-band ASE rejection. An example tunable bandpass optical filter may include a thermally, mechanically, or electrically (e.g., electrooptically) tuned cavity, such as a tuned dual etalon cavity. In some examples, a tunable filter may include an electrically tunable MEMS mirror and a fixed grating, or a tunable diffractive element such as a tunable Bragg grating or a tunable fiber grating.

In some examples, a fiber optic based wavelength selective switch (WSS) may be used to dynamically route, block, and attenuate selective wavelengths, such as the wavelengths corresponding to each of a plurality of DWDMs. In some examples, a fiber optic based 1×N switch may be combined with a number (N) WDMs or other filter elements. In some examples, a bandpass filter may include a plurality of independently selectable wavelength channels.

In some examples, a modem may include one or more tunable local oscillators (LO), and/or may include a tunable laser. The transmitter and receiver LO wavelengths may be selected to obtain the selected transmitter and/or receive wavelengths. The wavelength selections may be made independently (e.g., using two LOs) for transmit and receive, for example, based on the transmit and receive wavelengths of the selected wavelength plan. In some example, a transmitter may include a tunable laser. In some examples, a fixed wavelength laser may be used with a local oscillator (LO)

source and a fiber switch to obtain a multiple wavelength transmit/receive modem. An N×2, such as a 2×2, fiber switch may be used.

In some examples, a device may include: an optical configuration configured to transmit a transmitted optical beam at a transmit wavelength and receive a received optical beam at a receive wavelength; an optical modem configured to generate a transmitted optical signal and receive a received optical signal; and an optical amplifier, including an optical gain medium and an optical bandpass filter. The optical amplifier may be configured to amplify the transmitted optical signal from the optical modem and provide the transmitted optical beam to the optical configuration, and amplify the received optical beam from the optical configuration and provide the received optical signal to the optical modem. The transmitted optical beam may have a transmit wavelength selectable from a plurality of transmit wavelengths. The received optical beam may be received and processed using an optical configuration configured on a receive wavelength selectable from a plurality of receive wavelengths. In some examples, the transmit wavelength and the receive wavelength may be different wavelengths. One or more optical bandpass filters may be wavelength-selectable (which may also be termed frequency-selectable), and may be wavelength tunable, for example, based on the transmit wavelength and/or receive wavelength.

In some examples, the optical configuration may be configured to receive the received optical beam from a first remote location, such as a satellite, and direct the received optical beam to the optical amplifier, and to receive the transmitted optical beam from the optical amplifier and direct the transmitted optical beam to a second remote location, which may be the same as or different from the first remote location (e.g., the same satellite, or a different satellite or other remote location).

In some examples, the optical configuration may include a dichroic element. The dichroic element may be selectable from a plurality of dichroic elements, for example, based on the transmit wavelength and the receive wavelength. The transmitted optical beam may be reflected by the dichroic element and the received optical beam may be transmitted through the dichroic element, or vice versa. The dichroic element may provide different optical paths for the transmitted optical beam and the received optical beam through at least part of the optical configuration. In some examples, the optical configuration may include a plurality of dichroic elements, where the dichroic element may be selectable from the plurality of dichroic elements based on the transmit wavelength and the receive wavelength. One or more actuators may be used to select the dichroic element.

In some examples, an optical modem may include an optical modulator configured to generate the transmitted optical signal, where the transmitted optical signal is encoded with transmitted network data, and an optical demodulator configured to receive the received optical signal, demodulate the received optical signal, and, for example, to provide received network data from the received optical signal.

In some examples, an optical amplifier may be configured to receive the transmitted optical signal from the optical modulator, amplify the transmitted optical signal using an optical gain medium to generate the transmitted optical beam, and direct the transmitted optical beam to the optical configuration. The optical configuration may then direct the transmitted optical beam as a free-space optical beam to a remote communications terminal. In some examples, the optical configuration may be configured to direct the received optical beam to the optical amplifier, and the optical amplifier may be configured to amplify the received optical beam and provide the received optical signal to the optical demodulator. A dichroic element within the optical configuration may provide different optical paths for the transmitted and the received optical beams through at least part of the optical configuration. An optical modem may include one or more local oscillators, such as a transmitter local oscillator providing a transmitter local oscillator signal to the optical modulator. The wavelength of the transmitted optical beam may be adjustable using the transmitter local oscillator signal. For example, the transmit wavelength may be selectable by selecting one of a plurality of local oscillators. A receiver local oscillator may also be adjustable. In some examples, an optical switch assembly may be used to select a transmitter and/or receiver local oscillator from a plurality of local oscillators.

In some examples, an optical amplifier may include an optical bandpass filter, such as a tunable optical filter. In some examples, a wavelength-selectable switch may selectable to selectively transmit the transmit wavelength. An optical bandpass filter may include a plurality of wavelength division multiplexers selectable using a fiber optic switch.

In some examples, a method includes transmitting a first optical beam using an optical configuration, the first optical beam having a first wavelength selected from a plurality of transmit wavelengths, and receiving a second optical beam using the optical configuration, with the second optical beam has a second wavelength that is different from the first wavelength. The second optical beam may be amplified using an optical amplifier and demodulated to obtain network data. The first optical beam may be encoded with network data using an optical modulator. The optical configuration may include a dichroic element configured to receive the first optical beam along a first path and to direct the second optical beam to the optical amplifier along a second path, where the first and second paths may be different for at least a portion of the beam paths through the optical configuration. The dichroic element may be selected from a plurality of dichroic elements based on the first wavelength and the second wavelength.

In some examples, a wavelength-selectable free-space optical (FSO) communication system may use different selectable wavelengths for a transmit optical signal and a receive optical signal of a communication link between two communication terminals to provide isolation between the signals. For wavelength selection, one or more of the free-space optics, optical amplifier, and/or optical modulator-demodulator (modem) of the system employed by a terminal may select a particular one of a plurality of available transmit wavelengths and a different one of a plurality of available receive wavelengths. For example, the free-space optics may employ dichroic elements or the like to internally separate and/or combine the transmit and receive signals for use over the link between the terminals. In some embodiments, the use of a wavelength-selectable FSO communication system may facilitate flexibility in creating and maintaining optical communication links (e.g., intersatellite links between individual communication satellites of a communication constellation) using a variety of wavelength plans between multiple terminals while maintaining transmit/receive signal isolation.

In view of the discussion above in conjunction with FIGS. 1-17, wavelength-selectable FSO communication systems may include one or more communication terminals capable of implementing two or more different wavelength plans to facilitate communication between a variety of terminals.

Consequently, in some examples, optical communication networks employing numerous such terminals (e.g., tens or hundreds of satellites of a communication constellation) may facilitate the formation of communication links between the terminals that change over time, thus lending a significant amount of flexibility in communication configurations within the system.

EXAMPLE EMBODIMENTS

Example 1. An example device may include an optical configuration configured to transmit a transmitted optical beam at a transmit wavelength and receive a received optical beam at a receive wavelength, an optical modem configured to generate a transmitted optical signal and receive a received optical signal, and an optical amplifier, including an optical gain medium and an optical bandpass filter, configured to amplify the transmitted optical signal from the optical modem and provide the transmitted optical beam to the optical configuration, and amplify the received optical beam from the optical configuration and provide the received optical signal to the optical modem, where the transmitted optical beam has a transmit wavelength selectable from a plurality of transmit wavelengths and the transmit wavelength and the receive wavelength are different wavelengths.

Example 2. The device of example 1, where the optical configuration is configured to receive the received optical beam from a first remote location and direct the received optical beam to the optical amplifier, and receive the transmitted optical beam from the optical amplifier and direct the transmitted optical beam to a second remote location.

Example 3. The device of any of examples 1 or 2, where the optical configuration includes at least one dichroic element.

Example 4. The device of any of examples 1-3, where the transmitted optical beam is reflected by the dichroic element, and the received optical beam is transmitted through the dichroic element.

Example 5. The device of any of examples 1-3, where the transmitted optical beam is transmitted through the dichroic element, and the received optical beam is reflected by the dichroic element.

Example 6. The device of any of examples 1-5, where the optical configuration includes a plurality of dichroic elements, and the dichroic element is selectable from the plurality of dichroic elements based on the transmit wavelength and the receive wavelength.

Example 7. The device of any of examples 1-6, where the dichroic element is selectable from the plurality of dichroic elements using an actuator.

Example 8. The device of any of examples 1-7, where the optical modem includes an optical modulator configured to generate the transmitted optical signal where the transmitted optical signal is encoded with transmitted network data, and an optical demodulator configured to provide received network data from the received optical signal.

Example 9. The device of any of examples 1-8, where the optical amplifier is configured to receive the transmitted optical signal from the optical modulator, amplify the transmitted optical signal using the optical gain medium to generate the transmitted optical beam, and direct the transmitted optical beam to the optical configuration.

Example 10. The device of any of examples 1-9, where the optical configuration is configured to direct the received optical beam to the optical amplifier, and the optical amplifier is configured to amplify the received optical beam and provide the received optical signal to the optical demodulator.

Example 11. The device of any of examples 1-10, where the optical modem includes a transmitter local oscillator providing a transmitter local oscillator signal to the optical modulator, and the transmit wavelength of the transmitted optical beam is adjustable using the transmitter local oscillator signal.

Example 12. The device of any of examples 1-11, where the optical modem further includes a receiver local oscillator providing a receiver local oscillator signal to the optical demodulator, and the receiver local oscillator signal is adjustable.

Example 13. The device of any of examples 1-12, where the optical modem further includes a plurality of local oscillators, and an optical switch assembly configured to direct a first local oscillator signal from a first local oscillator of the plurality of local oscillators to the optical modulator, and direct a second local oscillator signal from a second local oscillator of the plurality of local oscillators to the optical demodulator.

Example 14. The device of any of examples 1-13, where the optical bandpass filter includes a tunable optical filter or a wavelength-selectable optical filter.

Example 15. The device of any of examples 1-14, where the optical bandpass filter includes a wavelength-selectable switch selectable to selectively transmit the transmit wavelength.

Example 16. The device of any of examples 1-15, where the optical bandpass filter includes a first fiber optic switch, a plurality of wavelength division multiplexers, and a second fiber optic switch, where the first fiber optic switch is configured to direct the transmitted optical signal through one of the plurality of wavelength division multiplexers and then through the second fiber optic switch.

Example 17. An example method may include transmitting a first optical beam using an optical configuration where the first optical beam has a first wavelength selected from a plurality of transmit wavelengths, receiving a second optical beam using the optical configuration where the second optical beam has a second wavelength different from the first wavelength, amplifying the second optical beam using an optical amplifier, and demodulating the second optical beam to obtain network data, where the optical configuration includes a dichroic element configured to receive the first optical beam along a first path and to direct the second optical beam to the optical amplifier along a second path, the second path being different to the first path.

Example 18. The method of example 17, where the dichroic element transmits the first optical beam and reflects the second optical beam to the optical amplifier.

Example 19. The method of any of examples 17 or 18, where the dichroic element reflects the first optical beam and transmits the second optical beam to the optical amplifier.

Example 20. The method of any of examples 17-19, further including selecting the dichroic element from a plurality of dichroic elements based on the first wavelength and the second wavelength.

As detailed above, controllers used to control device operational parameters may include computing devices, and may broadly include any type or form of computing device or system capable of executing computer-readable instructions. Computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory. In some examples, a controller may be configured to select a wavelength plan, and then select appropriate values for the transmit wavelength (e.g., by selecting a local oscillator), bandpass filter (e.g., by tuning or selecting a bandpass filter), select one or more dichroic elements, and the like.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor. A controller may include one or more physical processors.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed (such as sensor data), transform the data, output a result of the transformation to control an aspect of device operation, use the result of the transformation to control an aspect of device operation, and store the result of the transformation to control an aspect of device operation. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference may be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device, comprising:
    an optical configuration, configured to transmit a transmitted optical beam at a transmit wavelength and receive a received optical beam at a receive wavelength;
    an optical modem, configured to generate a transmitted optical signal and to receive a received optical signal; and
    an optical amplifier, comprising an optical gain medium and an optical bandpass filter, configured to:
        amplify the transmitted optical signal from the optical modem and provide the transmitted optical beam to the optical configuration; and
        amplify the received optical beam from the optical configuration and provide the received optical signal to the optical modem,
        wherein the optical bandpass filter comprises:
            a first fiber optic switch;
            a plurality of wavelength division multiplexers; and
            a second fiber optic switch, and wherein:
        the transmitted optical beam has the transmit wavelength selectable from a plurality of transmit wavelengths;
        the transmit wavelength and the receive wavelength are different wavelengths; and
        the first fiber optic switch is configured to direct the transmitted optical signal through one of the plurality of wavelength division multiplexers and then through the second fiber optic switch.

2. The device of claim 1, wherein the optical configuration is configured to:
    receive the received optical beam from a first remote location and direct the received optical beam to the optical amplifier; and receive the transmitted optical beam from the optical amplifier and direct the transmitted optical beam to a second remote location.

3. The device of claim 1, wherein the optical configuration comprises at least one dichroic element.

4. The device of claim 3, wherein:
the transmitted optical beam is reflected by the dichroic element; and
the received optical beam is transmitted through the dichroic element.

5. The device of claim 3, wherein:
the transmitted optical beam is transmitted through the dichroic element; and
the received optical beam is reflected by the dichroic element.

6. The device of claim 3, wherein:
the optical configuration comprises a plurality of dichroic elements; and
the dichroic element is selectable from the plurality of dichroic elements based on the transmit wavelength and the receive wavelength.

7. The device of claim 6, wherein the dichroic element is selectable from the plurality of dichroic elements using an actuator.

8. The device of claim 1, wherein the optical modem comprises:
an optical modulator configured to generate the transmitted optical signal, wherein the transmitted optical signal is encoded with transmitted network data; and
an optical demodulator configured to provide received network data from the received optical signal.

9. The device of claim 8, wherein the optical amplifier is configured to:
receive the transmitted optical signal from the optical modulator;
amplify the transmitted optical signal using the optical gain medium to generate the transmitted optical beam; and
direct the transmitted optical beam to the optical configuration.

10. The device of claim 8, wherein:
the optical configuration is configured to direct the received optical beam to the optical amplifier; and
the optical amplifier is configured to amplify the received optical beam and provide the received optical signal to the optical demodulator.

11. The device of claim 8, wherein:
the optical modem comprises a transmitter local oscillator providing a transmitter local oscillator signal to the optical modulator; and
the transmit wavelength of the transmitted optical beam is adjustable using the transmitter local oscillator signal.

12. The device of claim 8, wherein:
the optical modem further comprises a receiver local oscillator providing a receiver local oscillator signal to the optical demodulator; and
the receiver local oscillator signal is adjustable.

13. The device of claim 8, wherein the optical modem further comprises:
a plurality of local oscillators; and
an optical switch assembly configured to:
direct a first local oscillator signal from a first local oscillator of the plurality of local oscillators to the optical modulator; and
direct a second local oscillator signal from a second local oscillator of the plurality of local oscillators to the optical demodulator.

14. The device of claim 1, wherein the optical bandpass filter comprises a tunable optical filter.

15. The device of claim 1, wherein the optical bandpass filter comprises a wavelength-selectable switch selectable to selectively transmit the transmit wavelength.

16. A method comprising:
transmitting a first optical beam using an optical configuration, the first optical beam having a first wavelength selected from a plurality of transmit wavelengths;
receiving a second optical beam using the optical configuration, the second optical beam having a second wavelength different from the first wavelength;
amplifying the second optical beam using an optical amplifier; and
demodulating the second optical beam to obtain network data,
wherein the optical configuration comprises a dichroic element configured to receive the first optical beam along a first path and to direct the second optical beam to the optical amplifier along a second path, the second path being different to the first path,
wherein the optical amplifier comprises an optical bandpass filter comprising:
a first fiber optic switch;
a plurality of wavelength division multiplexers; and
a second fiber optic switch,
wherein the first fiber optic switch directs an optical signal through one of the plurality of wavelength division multiplexers and then through the second fiber optic switch.

17. The method of claim 16, wherein the dichroic element transmits the first optical beam and reflects the second optical beam to the optical amplifier.

18. The method of claim 16, wherein the dichroic element reflects the first optical beam and transmits the second optical beam to the optical amplifier.

19. The method of claim 16, further comprising selecting the dichroic element from a plurality of dichroic elements based on the first wavelength and the second wavelength.

* * * * *